United States Patent
Nobbe

(10) Patent No.: US 9,178,493 B1
(45) Date of Patent: Nov. 3, 2015

(54) MISMATCH DETECTION USING REPLICA CIRCUIT

(71) Applicant: PEREGRINE SEMICONDUCTOR CORPORATION, San Diego, CA (US)

(72) Inventor: Dan William Nobbe, Crystal Lake, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 24 days.

(21) Appl. No.: 14/272,415

(22) Filed: May 7, 2014

(51) Int. Cl.
*H04B 1/02* (2006.01)
*H03H 11/28* (2006.01)
*H03F 1/56* (2006.01)
*H04B 1/44* (2006.01)
*H04B 17/00* (2015.01)
*H01Q 11/12* (2006.01)

(52) U.S. Cl.
CPC ............... *H03H 11/28* (2013.01); *H03F 1/56* (2013.01); *H04B 1/44* (2013.01); *H04B 17/00* (2013.01); *H03F 2200/387* (2013.01); *H03F 2200/451* (2013.01)

(58) Field of Classification Search
CPC .......... H04B 1/0458; H03F 1/56; H03F 1/565
USPC ............................. 455/107; 343/852, 860, 861
See application file for complete search history.

(56) References Cited

U.S. PATENT DOCUMENTS

| | | | |
|---|---|---|---|
| 6,297,696 B1 * | 10/2001 | Abdollahian et al. .... | 330/124 R |
| 6,804,502 B2 | 10/2004 | Burgener et al. | |
| 7,248,120 B2 | 7/2007 | Burgener et al. | |
| 7,910,993 B2 | 3/2011 | Brindle et al. | |
| 2008/0284519 A1 * | 11/2008 | Andrews ........................ | 330/286 |
| 2011/0279178 A1 * | 11/2011 | Outaleb et al. ............ | 330/124 R |
| 2013/0222075 A1 | 8/2013 | Reedy et al. | |
| 2014/0097698 A1 * | 4/2014 | Wang et al. .................... | 307/104 |
| 2014/0184336 A1 | 7/2014 | Nobbe et al. | |
| 2014/0184337 A1 | 7/2014 | Nobbe et al. | |

FOREIGN PATENT DOCUMENTS

WO 2009108391 9/2009

OTHER PUBLICATIONS

Nobbe, Dan, "RF Transmit Path Calibration via On-Chip Dummy Load", Application and Figures filed in the USPTO on May 7, 2014 for related U.S. Appl. No. 14/272,387, 54 pgs.

Nobbe, et al., "Scalable Periphery Tunable Matching Power Amplifier", Application and Figures filed in the USPTO on Mar. 12, 2013 for related U.S. Appl. No. 13/797,779, 89 pgs.

(Continued)

*Primary Examiner* — Lee Nguyen
(74) *Attorney, Agent, or Firm* — Jaquez Land Richman LLP; Martin J. Jaquez, Esq.; Alessandro Steinfl, Esq.

(57) ABSTRACT

An apparatus for detecting an operating characteristic mismatch at an output of an amplifier by using a replica circuit is presented. In one exemplary case, a detected voltage difference at the output of the two circuits is used to drive a tuning control loop to minimize an impedance mismatch at the output of the amplifier. In another exemplary case, the replica circuit is used to detect a fault in operation in a corresponding main circuit. A method for detecting a load mismatch in a main RF circuit using the replica circuit is also presented.

49 Claims, 13 Drawing Sheets

(56) References Cited

OTHER PUBLICATIONS

Gaynor, Michael, "Methods and Devices for Impedance Matching in Power Amplifier Circuits", Application and Figures filed in the USPTO on Sep. 27, 2013 for related U.S. Appl. No. 14/042,312, 40 pgs.

Nobbe, et al., "Systems and Methods for Optimizing Amplifier Operations", Application and Figures filed in the USPTO on Mar. 4, 2013 for related U.S. Appl. No. 13/828,121, 29 pgs.

Gaynor, Michael, "Tunable Impedance Matching Network", Application and Figures filed in the USPTO on Aug. 15, 2013 for related U.S. Appl. No. 13/967,866, 36 pgs.

Kaatz, et al., "Variable Impedance Match and Variable Harmonic Terminations for Different Modes and Frequency Bands", Application and Figures filed in the USPTO on Mar. 12, 2013 for related U.S. Appl. No. 13/797,686, 42 pgs.

Gaynor, Michael, "Methods and Devices for Thermal Control in Power Amplifier Circuits", Application and Figures filed in the USPTO on Sep. 30, 2013 for related U.S. Appl. No. 14/042,331, 38 pgs.

Nobbe, et al., "Hot Carrier Injection Compensation", Application and Figure filed in the USPTO on Apr. 1, 2014 for related U.S. Appl. No. 14/242,373, 31 pgs.

\* cited by examiner

MISMATCH DETECTION USING REPLICA CIRCUIT

CROSS REFERENCE TO RELATED APPLICATIONS

The present application is related to U.S. patent application Ser. No. 14/272,387 entitled "RF Transmit Path Calibration via On-Chip Dummy Load" filed on even date herewith and incorporated herein by reference in its entirety.

The present application may be related to U.S. patent application Ser. No. 13/797,779 entitled "Scalable Periphery Tunable Matching Power Amplifier", filed on Mar. 12, 2013, the disclosure of which is incorporated herein by reference in its entirety. The present application may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. The present application may also be related to U.S. patent application Ser. No. 13/595,893, entitled "Methods and Apparatuses for Use in Tuning Reactance in a Circuit Device", filed on Aug. 27, 2012, the disclosure of which is incorporated herein by reference in its entirety. The present application may also be related to U.S. patent application Ser. No. 14/042,312, filed on Sep. 30, 2013, entitled "Methods and Devices for Impedance Matching in Power Amplifier Circuits", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to U.S. patent application Ser. No. 13/967,866 entitled "Tunable Impedance Matching Network", filed on Aug. 15, 2013, the disclosure of which is incorporated herein by reference in its entirety. The present application may also be related to U.S. patent application Ser. No. 13/797,686 entitled "Variable Impedance Match and Variable Harmonic Terminations for Different Modes and Frequency Bands", filed on Mar. 12, 2013, the disclosure of which is incorporated herein by reference in its entirety. The present application may also be related to U.S. patent application Ser. No. 13/829,946 entitled "Amplifier Dynamic Bias Adjustment for Envelope Tracking", filed on Mar. 14, 2013, the disclosure of which is incorporated herein by reference in its entirety. The present application may also be related to U.S. patent application Ser. No. 14/242,373 entitled "Hot Carrier Injection Compensation", filed on Apr. 1, 2014, the disclosure of which is incorporated herein by reference in its entirety.

BACKGROUND

1. Field

The present teachings relate to VSWR (voltage standing wave ratio) detection. More particularly, the present teachings relate to VSWR detection using a replica circuit.

2. Description of Related Art

VSWR (voltage standing wave ratio) is a metric commonly used to indicate a degree of impedance mismatch between two different stages in a circuit (e.g. a power amplifier and a transmitting antenna). A VSWR of 1:1 indicates a perfect impedance match (e.g. no reflected wave) while higher measures of VSWR indicate higher degrees of impedance mismatch (e.g. a VSWR of 10:1 indicates higher impedance mismatch than a VSWR of 5:1). In prior art embodiments, measurement of VSWR can be performed using a dual directional coupler and a complete power detector in order to measure both forward and reflected waves from which the VSWR measurement can be derived.

For example, an impedance mismatch between two stages of a circuit such as a power amplifier and a transmitting antenna can occur because antenna impedance can be influenced by a surrounding environment of the transmitting antenna. By way of example, and not of limitation, at assembly time the antenna may have a particular surrounding environment, leading to a first value of antenna impedance. The power amplifier may be matched to the first value of the antenna impedance. If the environment surrounding the antenna changes, antenna impedance may change to a second value as a result of the environmental change. As one example, placing the transmitting antenna on a metal table can alter the antenna impedance, causing an impedance mismatch between the power amplifier and the transmitting antenna. As another example, metal objects in proximity to the transmitting antenna can affect the antenna impedance.

SUMMARY

According to a first aspect of the present disclosure, an arrangement for detecting and controlling impedance mismatch in a radio frequency (RF) circuit is presented, the arrangement comprising: a first RF circuit that is configured, during operation of the arrangement, to amplify a first input signal, thus producing a first output signal at an output port of the first RF circuit that is an amplified version of the first input signal; a first load coupled to the output port of the first RF circuit; a second RF circuit that is configured, during operation of the arrangement, to amplify a second input signal, thus producing a second output signal that is an amplified version of the second input signal, the second RF circuit being a reduced size replica of the first RF circuit; a second load connected to an output terminal of the second RF circuit, configured, during operation of the arrangement, to provide a substantially matched impedance at the output terminal of the second RF circuit; and a detector that is configured, during operation of the arrangement, to compute a difference between the first output signal and the second output signal, thus producing a difference signal, wherein the difference signal is a function of impedance mismatch between the first RF circuit and the first load.

According to a second aspect of the present disclosure, an arrangement is presented, the arrangement comprising: a detector having a first input terminal, a second input terminal, and an output terminal; a first amplifying circuit having an amplified output connected, in operation, to a radio frequency (RF) path comprising one or more RF components, the first circuit adapted to receive, in operation, an (RF) signal input, wherein a first sensing point in the RF path is connected to the first input terminal of the detector; and a second amplifying circuit having an amplified output connected, in operation, to an impedance network, the second circuit adapted to receive, in operation, a scaled version of the RF signal input, the second circuit being a reduced size replica of the first circuit, wherein a first reference point in the impedance network is connected to the second input terminal of the detector, wherein the detector is adapted, during operation of the arrangement, to detect a difference signal based on a difference between an operating characteristic of the first amplifying circuit associated to the first sensing point and an operating characteristic of the second amplifying circuit associated to the first reference point.

According to a third aspect of the present disclosure a method for load mismatch detection in a radio frequency (RF)

circuital arrangement is presented, the method comprising: amplifying an RF signal via a first amplifying circuit; based on the amplifying, matching a first amplified signal to a first load via a tunable matching circuit; amplifying a scaled version of the RF signal via a second amplifying circuit, the second amplifying circuit being a reduced size version of the first amplifying circuit; based on the matching, providing a second load to the second amplifying circuit; based on the providing, measuring a difference in an operating characteristic between the first amplified signal and the second amplified signal, and based on the measuring, detecting a mismatch between the first amplified signal and the first load.

According to a fourth aspect of the present disclosure a method for component fault detection in a radio frequency (RF) circuital arrangement is presented, the method comprising: during a first phase of operation of the arrangement, performing the following steps i) to v): i) amplifying an RF signal via a first amplifying circuit; ii) based on the amplifying, matching a first amplified signal to a first load via a tunable matching circuit; iii) based on the matching, storing a configuration of the tunable matching circuit; iv) providing a second amplifying circuit, the second amplifying circuit being a reduced size version of the first amplifying circuit; and v) based on the matching, providing a second load to the second amplifying circuit; during a second phase of operation of the arrangement, performing the following steps vi) to x): vi) restoring the configuration of the tunable matching circuit based on the matching; vii) amplifying an RF signal via the first amplifying circuit; viii) amplifying a scaled version of the RF signal via the second amplifying circuit; ix) measuring a difference signal based on a difference in an operating characteristic between an amplified signal at the first load and an amplified signal at the second load; and x) based on the measuring, determining a fault in the arrangement.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The term "amplifier" as used in the present disclosure is intended to refer to amplifiers comprising single (e.g. stack height of one) or stacked transistors (e.g. stack height greater than one) configured as amplifiers, and can be used interchangeably with the terms "power amplifier (PA)" and "RF amplifier". Such terms can refer to a device that is configured to amplify an RF signal input to the device to produce an output RF signal of greater magnitude than the magnitude of the input RF signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e.g., pre-driver, driver, final), known to those skilled in the art.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the term "band" can refer to a frequency range. More in particular, the term "band" as used herein refers to a frequency range that can be defined by a wireless standard such as, but not limited to, wideband code division multiple access (WCDMA) and long term evolution (LTE).

As used in the present disclosure, the term "channel" can refer to a frequency range. More in particular, the term "channel" as used herein refers to a frequency range within a band. As such, a band can comprise several channels used to transmit/receive a same wireless standard.

Figure 1:
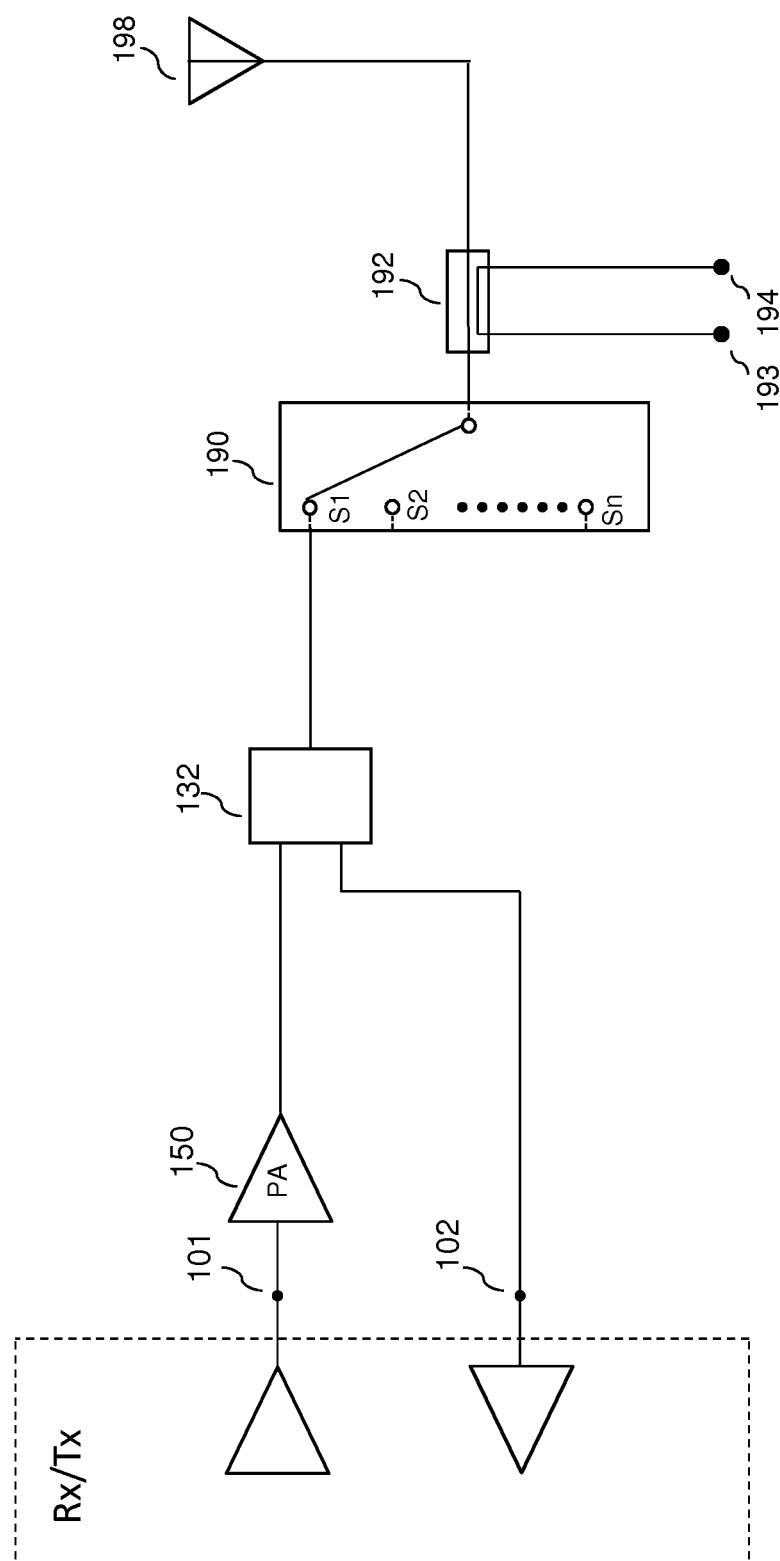
FIG. 1 shows a prior art radio frequency (RF) circuital arrangement wherein a dual directional coupler is used to detect a VSWR.

FIG. 1 shows a prior art circuital arrangement which can be part of an RF front-end stage of an RF device. In the circuital arrangement of FIG. 1, an RF signal at an input terminal (101) can be amplified by an amplifier (e.g. amplifier module) (150) and transmitted to antenna (198) through a transmit path which can include a duplexer unit (132). An antenna switch (190) can connect (e.g. switch in/out) a plurality of such transmit paths (e.g. comprising elements 150, 132) to the antenna (198). At the same time, a received RF signal at the antenna (198) can be routed to an input amplifier, such as a low noise amplifier (LNA) of a transceiver unit, via a receive path which can connect to the input amplifier at an input terminal (102) of the transceiver unit. Similar to the transmit case, a plurality of receive paths can be connected via the antenna switch (190) to a plurality of LNAs of a transceiver unit.

In the circuital arrangement of FIG. 1, a dual directional coupler (192) between the antenna (198) and the antenna switch (190) can be used to detect a mismatch in a transmit and/or receive path and therefore can allow tuning the transmit and/or a receive path of the circuit according to the detected mismatch. Upon detection of a transmitted and a reflected waveform at terminals (193) and (194) of the dual directional coupler (192), a VSWR at the antenna can be derived and a compensating action upon adjustable elements of the antenna or other adjustable elements within the transmit path or amplifier itself can be performed such as to tune the circuital arrangement for a reduction in VSWR. This is shown in the exemplary embodiment depicted in FIG. 2, wherein a tunable match network (230) can be coupled to the antenna (198) to tune the antenna for VSWR reduction. Alternatively or in addition, a similar tunable match (235) can be coupled to the amplifier (150) which can be used to reduce VSWR contributed by an impedance mismatch at the output of the amplifier. Using the same directional coupler (192) of FIG. 2, a VSWR of a received signal at the input of a tuning circuit (203) can be measured using transmitted and reflected waveforms at terminals (193) and (194) of the dual directional coupler (192), and reduced via adjustments to the tuning circuit (203).

Figure 2:
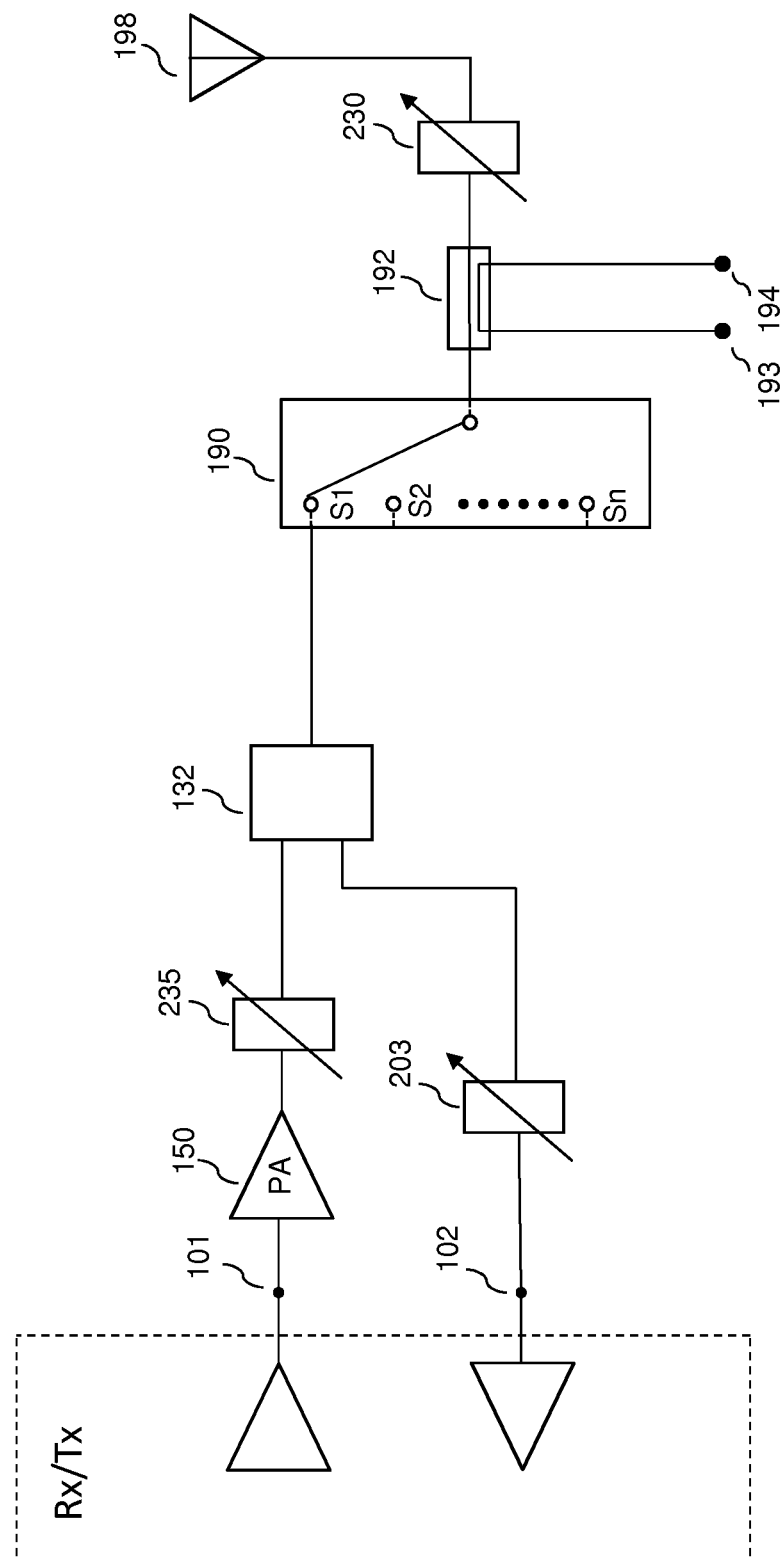
FIG. 2 shows an RF circuital arrangement wherein tuning elements within a transmit and/or receive RF path can be used to adjust characteristics of a path based on a VSWR signal detected by a dual directional coupler.

Although the dual directional coupler (192) of FIG. 2 can provide some information on the matching quality at the point where it is placed (e.g. between antenna and switch) and help in reducing (e.g. via match tuning) signal reflection at that point, it cannot provide information on the matching quality of the power amplifier module (150) to the tunable match circuit (235). As such, tuning of the matching at the antenna via the dual directional coupler (192) is performed irrespective of the quality of matching between the amplifier module (150) and the tunable match circuit (235). This shortcoming can be solved by placing an additional dual directional coupler at the vicinity of the power amplifier module and use it to locally detect a mismatch due to the amplifier output. However, such configuration can be impractical due to the size of such directional coupler and the added insertion loss it can provide. Furthermore, for a case where a transmit and/or receive path is used for several modes/channels (e.g. RF signals operating at various different center frequencies), more than one such dual directional coupler may be needed to support the wider range of frequencies being used, and therefore even higher insertion loss due to the usage of more couplers can be expected. It follows that the various teachings according to the present disclosure provide methods and devices to detect and reduce a mismatch at points in the transmit path without using a dual directional coupler. Such mismatch, which can contribute, for example, to a VSWR component, can be measured at any point within the transmit path and not restricted to a point a the vicinity of the antenna, as, for example, depicted in FIGS. 1-2. In this context, a mismatch can be defined by a deviation of an operating parameter value within a transmit and/or receive path from a desired value, such as measured, for example, by characteristic operating signal such as a voltage and/or a current at a given point of a corresponding circuit.

Figure 3A:
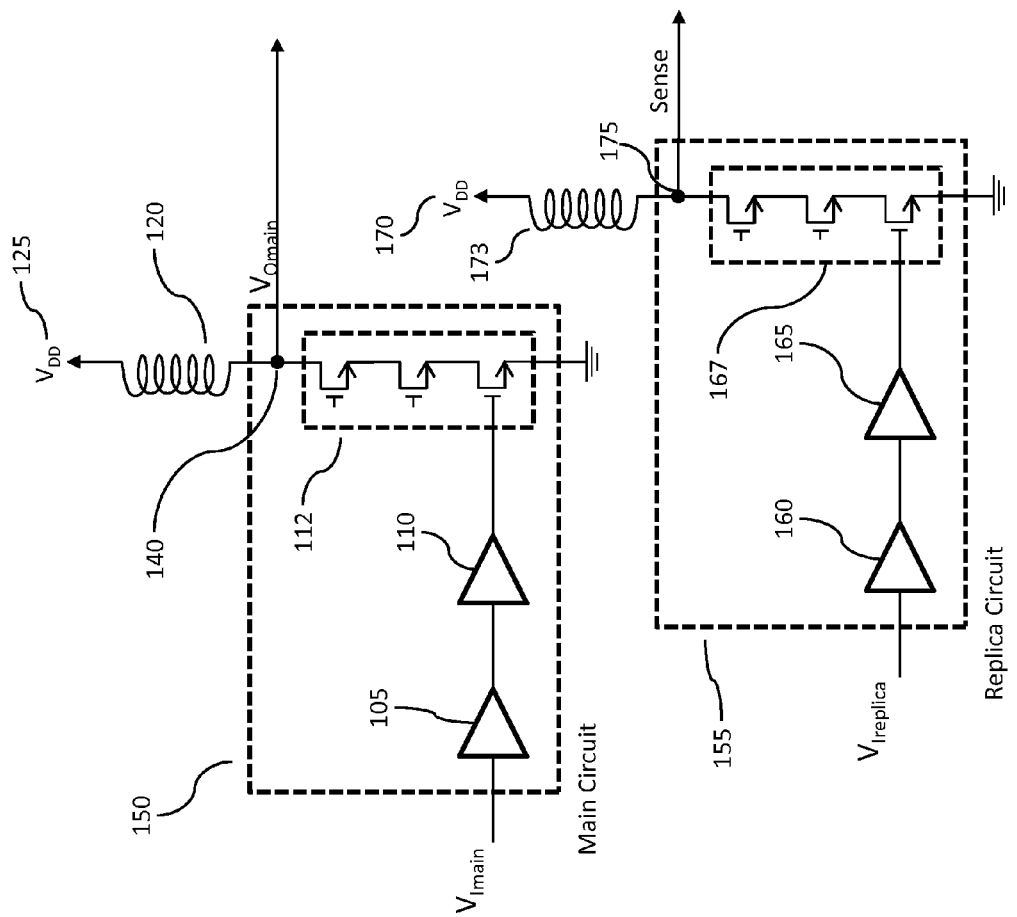
FIGS. 3A-3B show an RF circuital arrangement comprising a main circuit and a replica circuit, the replica circuit being a reduced size replica of the main circuit and capable of tracking a characteristic of the main circuit.
Figure 3B:
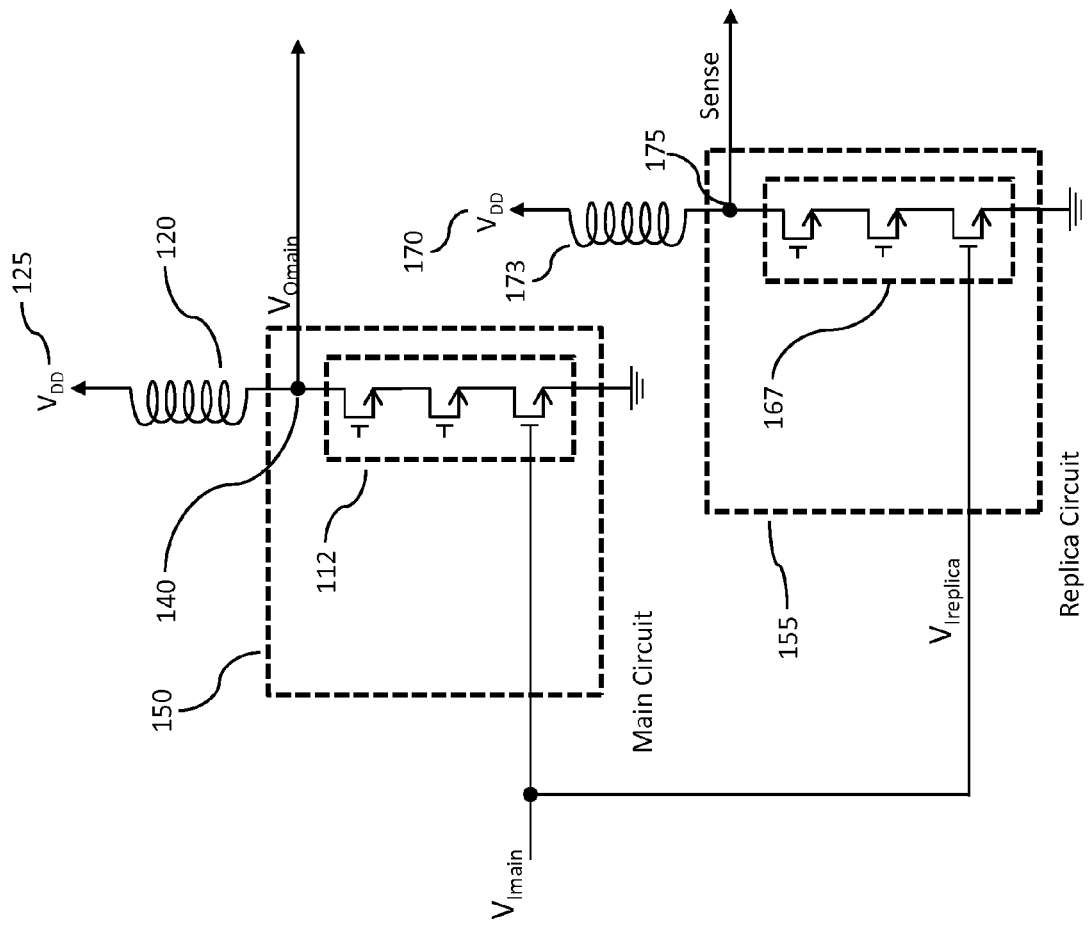
Figure 4:
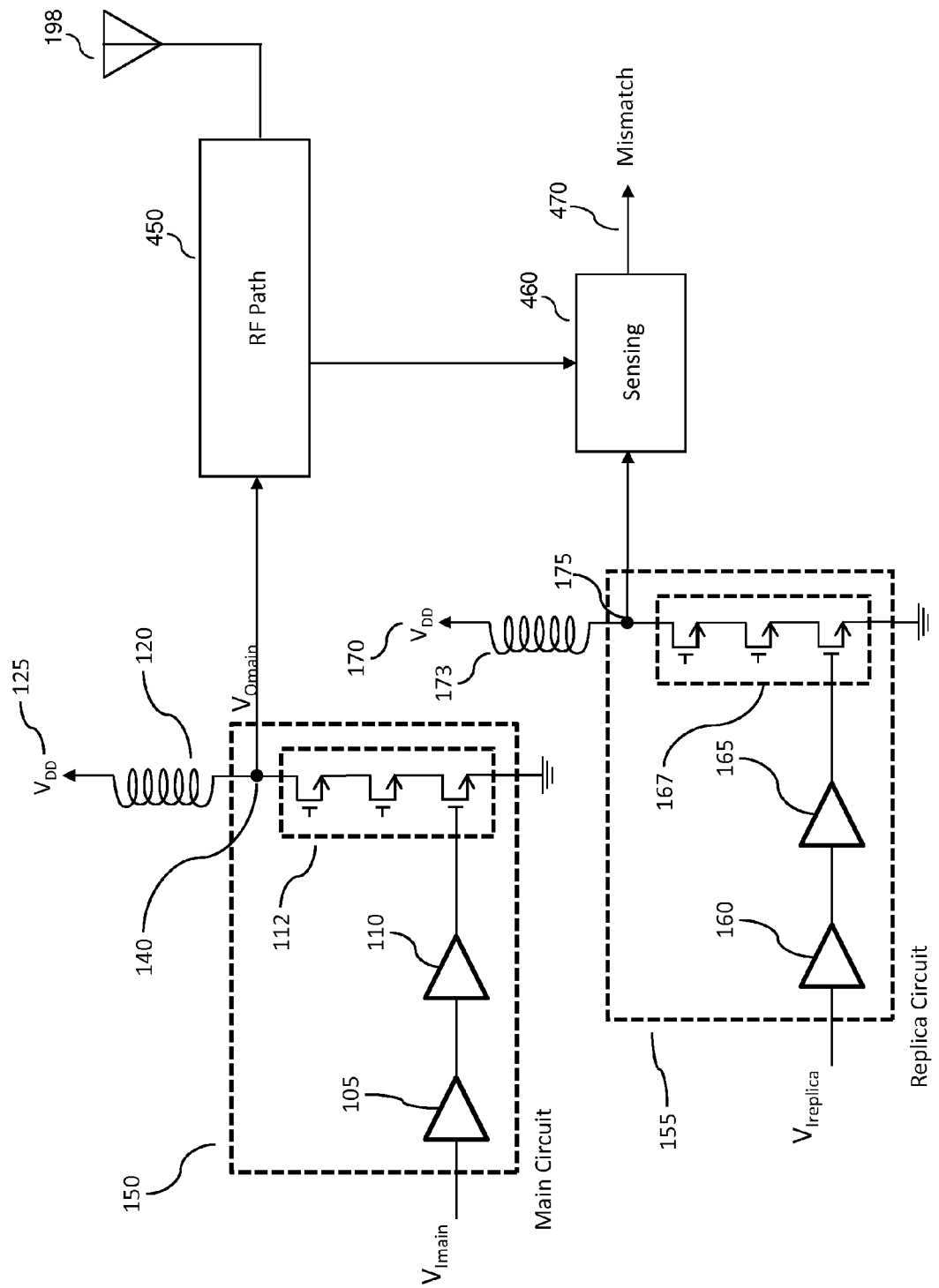
FIG. 4 shows an arrangement according to an embodiment of the present disclosure wherein a replica circuit is used as a reference circuit to detect a mismatch in an operating characteristic of a main circuit.

According to an aspect of the present disclosure, FIG. 3A shows a main circuit (150) which can be used as an RF amplification module in an RF transmit path, and a replica circuit (155) which can be used to detect a mismatch condition in the transmit path. An exemplary circuital arrangement for mismatch detection using the main circuit (150) and the replica circuit (155) (e.g. and without usage of a directional coupler) is shown in FIG. 4, and is described in ensuing sections of the present disclosure. The main circuit (150) (e.g. a power amplifier module) of FIG. 3A can comprise one or more amplifiers (e.g. 105, 110) followed by a final amplifier stage (112). In some other embodiments according to the present disclosure the main circuit (150) can comprise only the final amplifier stage (112) without the cascaded pre-drivers (105, 110), as depicted in FIG. 3B. A main circuit input voltage signal $V_{Imain}$ can be fed into the main circuit (150) to be amplified, beginning, for example, with amplifier (105). Biasing of the final amplifier stage (112) for a desired operation of the amplifier can be provided via bias voltage(s) fed to the gates of the various constituent transistors, and as described, for example, in the referenced U.S. Pat. No. 7,248,120 and U.S. application Ser. No. 13/829,946, both of which are incorporated herein by reference in their entirety. In the exemplary embodiment depicted in FIGS. 3A-3B, the final amplifier stage (112) can comprise a plurality of stacked amplifiers, although according to other embodiments according to the present disclosure the final amplifier stage can comprise a single transistor (e.g. stack height of one). An output node (140) of the main circuit (150) is connected through an inductor (120) to a supply voltage (125). An amplified RF output of the main circuit (150) can be observed at the output mode (140) which in a typical arrangement can be connected to some type of load and/or matching circuit as depicted in the various figures of the present disclosure.

Although the amplifier stage (112) of FIGS. 3A-3B is shown as comprising a plurality of stacked FET transistors (e.g. MOSFETs), the skilled person would also recognize that other types of transistors, whether stacked or single, such as, for example, bipolar junction transistors (BJTs) can be used instead or in combination with the N-type or P-type MOSFETs of the stack of (112). Also, as previously noted a stack height more than one, as depicted by (112) in FIGS. 3A-3B, is purely exemplary as teachings according to the present disclosure equally apply to stacks comprising a single transistor each. However, the person skilled in the art will appreciate some of the benefits provided by higher stack heights, such as a power handling capability greater than a power handling capability of a single transistor stack, because a voltage present across a single transistor may be sufficiently high to damage the one transistor, as opposed to dividing the voltage across the multiple transistors of a higher height stack. More information about stacked transistors of height greater than one can be found, for example, in U.S. Pat. No. 7,248,120, issued on Jul. 24, 2007, entitled "Stacked Transistor Method and Apparatus", which is incorporated herein by reference in its entirety. Although not shown in FIGS. 3A-3B, gate capacitors can be added to the gates of the cascode devices (e.g. FETs above the input FET) of the stack, such as to allow gate voltages (voltage across the respective gate capacitor) of the cascode devices (e.g. FETs), respectively, to float, that is let the gate voltages vary along with the RF signal at the drain of the corresponding FET of the stack, which consequently allow control (e.g. evenly distribute) of the voltage drop across the cascode devices for a more efficient operation of the transistor stacks. See for example, the referenced U.S. Pat. No. 7,248,120 for more information. Higher stack heights can, for example, be achieved when using non bulk-Silicon technology, such as insulated Silicon on Sapphire (SOS) technology and silicon on insulated (SOI) technology. In general, the various circuits used in the various embodiments of the present disclosure, such as the main circuit (150) and the replica circuit (155), when monolithically integrated, can be constructed using CMOS, silicon germanium (SiGe), gallium arsenide (GaAs), gallium nitride (GaN), bipolar transistors, or any other viable semiconductor technology and architecture known to the person skilled in the art.

An aspect in accordance with several embodiments of the present disclosure is to use a replica circuit (155), with input voltages and bias voltages similar (e.g. same or scaled) to the main circuit (150), that is smaller (e.g. with respect to operating power, current and also physical size) than the main circuit (150), and that is essentially impedance matched at its output, as a reference to an operating condition of the main circuit. In other words, the replica circuit being essentially impedance matched at its output is therefore configured to see at its output node (175), at all time and under all operating conditions, an impedance which represents a desired matched impedance at the output of the main circuit (150). Because the replica circuit (155) is essentially impedance matched, during operation the replica circuit (155) can be construed as an ideal version of the main circuit (150) under operation. Identical output characteristics, such as, for example, power, voltage, current, etc. . . . from both the main circuit (150) and the replica circuit (155), can indicate that the main circuit (150) is operating under ideal (e.g. desired) impedance matching conditions (e.g. essentially impedance matched), and therefore is not experiencing an impedance mismatch. A difference in an output characteristic (e.g. operating characteristic) observed between the output (140) of the main circuit (150) and the output (175) of the replica circuit (155) can indicate a deviation from ideal impedance matching conditions, and therefore indicate an impedance mismatch at the output (140) of the main circuit (150). A voltage signal, a current signal or a power signal can be exemplary output characteristics of the replica and main circuit. The person skilled in the art will understand that the input voltage to the replica circuit (155) need not be exactly the same as the input voltage to the main circuit (150), as a scaled voltage derived from the input voltage $V_{Imain}$ provided to the main circuit (150) can be provided to the replica circuit (155) as $V_{Ireplica}$, and still use the replica circuit as a reference. Similarly, the output characteristics (e.g. voltages, currents, power, etc. . . . ) from the two circuits need not be exactly the same to indicate an ideal match so long a known relationship between these characteristics indicating an ideal match is established, such as for example the case where a scaled input voltage is provided to the replica circuit, and/or the case where the gain of the replica circuit (155) is a scaled version of the gain of the main circuit (150).

According to one exemplary embodiment of the present disclosure, the replica circuit (155) can comprise an identical arrangement of components (e.g. with reduced size) to the arrangement of the main circuit (150). Accordingly and with further reference to FIG. 3A, the replica circuit (155) can comprise one or more amplifiers (160, 165) followed by a final amplifier stage (167), similar to an arrangement of the main circuit (150). In this embodiment, the final amplifier stage (167) can comprise a plurality of stacked amplifiers as depicted in FIG. 3A, but as previously noted alternative arrangements comprising a single amplifier comprising a stack height of one or more are also possible, as depicted in FIG. 3B. A replica circuit input voltage signal $V_{Ireplica}$ that can be identical or scaled to the main circuit input voltage signal $V_{Imain}$ can be fed into the replica circuit (155), beginning, for example, with amplifier (160). According to some embodiments of the present disclosure, the two inputs can be tied together to receive a same input signal, as depicted in FIG. 3B. An output node (175) of the replica circuit (155) can be connected through an inductor (173) to a supply voltage (170) of the replica circuit (155). The supply voltage (170) of the replica circuit (155) can provide voltage equal to that provided by the supply voltage (125) of the main circuit (150) (e.g. can be a same supply). As previously noted, biasing to the final stage (167) can also be same or a scaled version of biasing provided to final stage (112) of the main circuit.

According to an embodiment of the present disclosure, devices within the replica circuit (155) are smaller than devices within the main circuit (150). By way of example, and not of limitation, devices within the replica circuit (155) can be approximately $1/100^{th}$ the size of devices within the main circuit (150) so as to draw less current and use less power (e.g. about $1/100^{th}$ or less current and power usage) than the main circuit (150) and so that when monolithically integrated can consume less circuit die area. U.S. patent application Ser. No. 14/242,373 entitled "Hot Carrier Injection Compensation", filed Apr. 1, 2014, which is incorporated herein by reference in its entirety, further describes a replica circuit of smaller size than a main circuit. According to other embodiments of the present disclosure, replica circuit size can be even smaller than $1/100^{th}$ and down to $1/1000^{th}$ or less the size of the main circuit for even less power consumption and more compact monolithic integration. According to a further embodiment of the present disclosure, by monolithically integrating the main circuit (150) and the replica circuit (155) on a same die, the two circuits can be matched in temperature and by fabricating the two circuits using a same technology (e.g. same device parameters), both circuits drift in a similar manner with respect to temperature. Therefore, a drift in operation of the main circuit (150) can cause a similar drift in operation of the replica circuit (155), in other words, the two circuits can track each other. By further monolithically integrating a load associated to the replica circuit, such as, for example, loads ($Z_1$, $Z_3$) of FIG. 5A and/or load (777) depicted in FIG. 7, both figures being later described, with the replica circuits (and main circuit), impedance matching between the replica circuit (155) and the load (777) can be maintained irrespective of a temperature drift. Therefore when the main circuit, replica circuit and the load are monolithically integrated and fabricated using a same fabrication technology, the combination of the replica circuit (155) and the load (777) can be used as a reference setup for matching of the main circuit (150) to the output load (735).

FIG. 4 shows an aspect of the present teachings using the replica circuit (155) as a reference circuit to the main circuit (150), to detect a mismatch condition in an RF path (450) coupled to the output node (140) of the main circuit (150). A sensing circuit (460) coupled at a sensing point of the RF path (450) and coupled to the replica circuit (155), can compare an actual operating characteristic (e.g. voltage, current, power, etc. . . . ) of the main circuit (150) to a desired (e.g. reference) operating characteristic of the replica circuit (155). The sensing circuit can be coupled at a point of the RF path defined by an expected impedance (e.g. at a given operating frequency) between the output of the main circuit and that point of the RF path. The sensing circuit can also provide a loading to the replica circuit (155) to match the expected loading provided to the main circuit (150) by the RF path (450) and therefore sense an operating characteristic of the replica circuit at a point equivalent to the sensing point at the RF path. By comparing an operating characteristic (at a sensing point) of the main circuit under an actual load to an operating characteristic of the replica circuit under a provided (e.g. by the sensing circuit) reference load, the reference load being, for example, a fixed load representing a desired actual load, a mismatch condition at the sensing point of the RF path can be detected. The mismatch can represent, for example, a VSWR condition at the sensing point of the RF path. The operating characteristic can be a voltage, a current, a power or any other characteristic defining operation of an amplification stage under load and a VSWR condition, for example, can be derived from an associated mismatch of the operating characteristic.

Figure 5A:
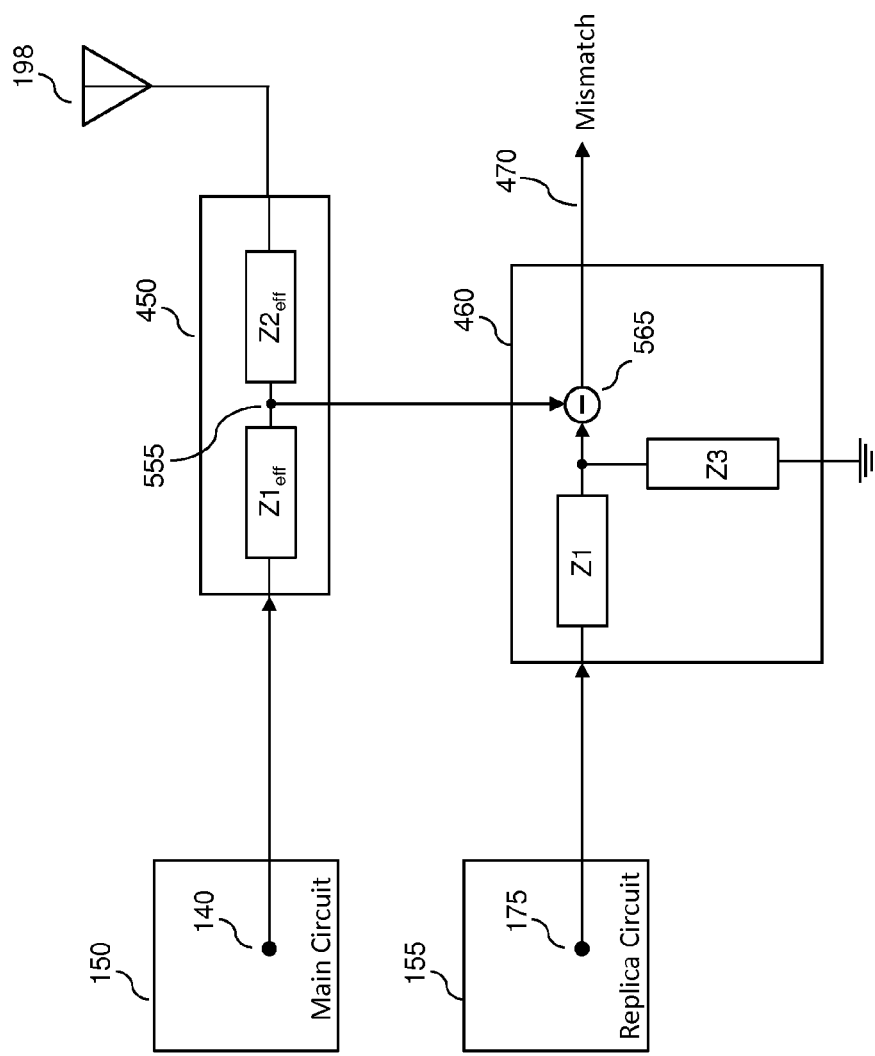
FIG. 5A shows some details of the output loading of the main circuit and the replica circuit of the arrangement represented in FIG. 4.

As depicted in FIG. 4, the sensing circuit can subsequent to a comparison of an operating characteristic of the main and the replica circuits provide a control signal at its output (470) to indicate a degree of mismatch, as measured, for example, by a difference in value between the two detected operating characteristics. For example, if the operating characteristic is a current, then the output signal at node (470) of the sensing circuit (460) can be, for example, a voltage representing the difference between a current output by the main circuit (150) and detected at the sensing point of the RF path (450), and a current output by the replica circuit (155) and detected at an equivalent point within an output load of the replica circuit, as depicted in FIG. 5A. According to some embodiments of the present disclosure, the degree of mismatch can be used to detect a fault in operation of the combined main circuit, RF path and associated load. For example, in a case where the degree of mismatch exceeds a reasonable threshold determined by various production and quality control tests of the circuital arrangement depicted in FIG. 4, then it would be reasonable to associate such a degree of mismatch to a fault in operation of the combined main circuit, RF path and associated load. The person skilled in the art readily understands that by virtue of its reduced size, lower power consumption and possible tight integration, the replica circuit and associated load can be less susceptible to damage resulting in an operational fault than the combined main circuit, RF path and associated load (e.g. antenna). More details with respect to fault detection using the replica circuit can be found in later paragraphs of the present disclosure.

FIG. 5A represents the circuital arrangement of FIG. 4 wherein the RF path (450) and the sensing circuit (460) are represented by exemplary equivalent impedances. For example, the RF path (450) can comprise two elements, represented by their equivalent effective operating impedances $Z_{1eff}$ and $Z_{2eff}$, followed by the antenna (198). On the other hand, the sensing circuit can be designed to comprise two impedances $Z_1$ and $Z_3$ representing equivalent impedances of the RF path (450) under desired (e.g. matching) operating conditions. For example, $Z_1$ can have a value representing a desired matching value for $Z_{1eff}$ and $Z_3$ can have a value representing a desired matching value of $Z_{2eff}$ in series with a desired matching value of the antenna impedance. As such, the load seen by the replica circuit (155) can be, under all operating conditions, a matched load for a desired operating performance of the main circuit (150). It should be noted that such (equivalent) impedances can be reactive and/or resistive depending on the design of the RF path (450). Additionally, FIG. 5A shows a sensing point (555) of the RF path (450) which is used to detect, by the sensing circuit (460), an operating characteristic of the main circuit under load (e.g. load provided by the RF path and antenna). A signal, such as for example a voltage, at operating point (555) is routed to a comparison circuit block (565) of the sensing circuit (460) which compares the signal at the operating point (555) with a reference signal at a point in the load provided to the replica circuit equivalent to the operating point (555).

Figure 5B:
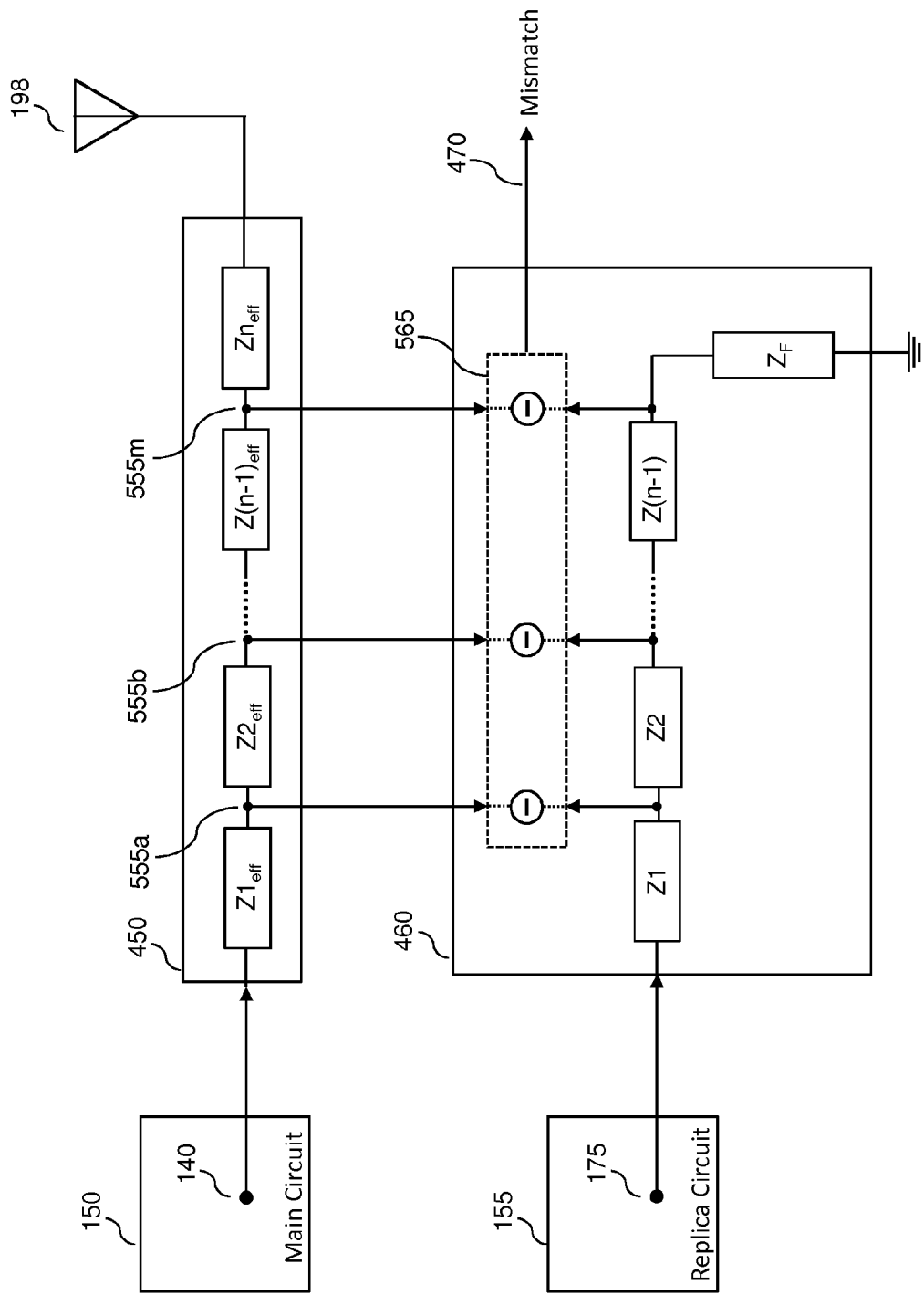
FIG. 5B shows a similar circuital representation as in FIG. 5A, for a case where the mismatch is detected for a plurality of operating points within an RF path coupled to the main circuit.

Although the exemplary embodiment according to the present disclosure and as depicted in FIG. 5A shows sensing one point within the RF path (450) and comparing to a reference point obtained via the replica circuit and a provided load which represents a desired matched load provided to the main circuit (150) via the RF path (450), the person skilled in the art will realize how this same concept can be extended to a plurality of different sensing points in the RF path (450), each sensing point having an equivalent point in an output path of the replica circuit and as provided by a design of the corresponding load and depicted in FIG. 5B.

According to a further embodiment of the present disclosure, FIG. 5B shows an exemplary implementation where a plurality of operating points ($555a, 555b, \ldots, 555m$) in the RF path (450) coupled to the main circuit (150) are sensed by a sensing circuit (460) and compared, via a comparison circuit (565), to a set of reference operating points obtained via an impedance network ($Z_1, Z_2, \ldots, Z_{(n-1)}, Z_F$) coupled to the reference replica circuit (155). As described in the previous sections and referring to FIG. 5A, the impedance network ($Z_1, Z_2, \ldots, Z_{(n-1)}, Z_F$) is designed to provide a loading configuration to the replica circuit (155) equivalent to a matched loading provided to the main circuit (150) via the RF path (450), the matched loading providing a desired operating characteristics to the main circuit (150). According to the embodiment of the present disclosure depicted by FIG. 5B, the comparison circuit (565) senses and compares an actual operating point in the RF path with a reference operating point in the impedance network and outputs a signal representing the result of such sensing and comparison. Such signal can be output at the terminal (470) of the sensing circuit (460).

With further reference to FIG. 5B, since a plurality of operating points are sensed and compared, the output signal at the terminal (470) can comprise a plurality of signals, each corresponding to a comparison of one sensed operating point. Alternatively, and as within the ability of a person skilled in the art, other circuit implementations can be devised such as to provide the task of sensing and comparing. In one possible exemplary implementation, switches can be used to select and feed one operating point signal and a corresponding reference signal to a same sensing and comparison circuit. In yet another possible implementation, a single mismatch signal can be output at terminal (470) under control of a control signal which can select the corresponding operating point. Such single mismatch signal can be associated to a real time sensing and comparison performed as per the requested control signal, or can be associated to a location in memory wherein the sensing circuit (460) stores measured mismatches.

Figure 6A:
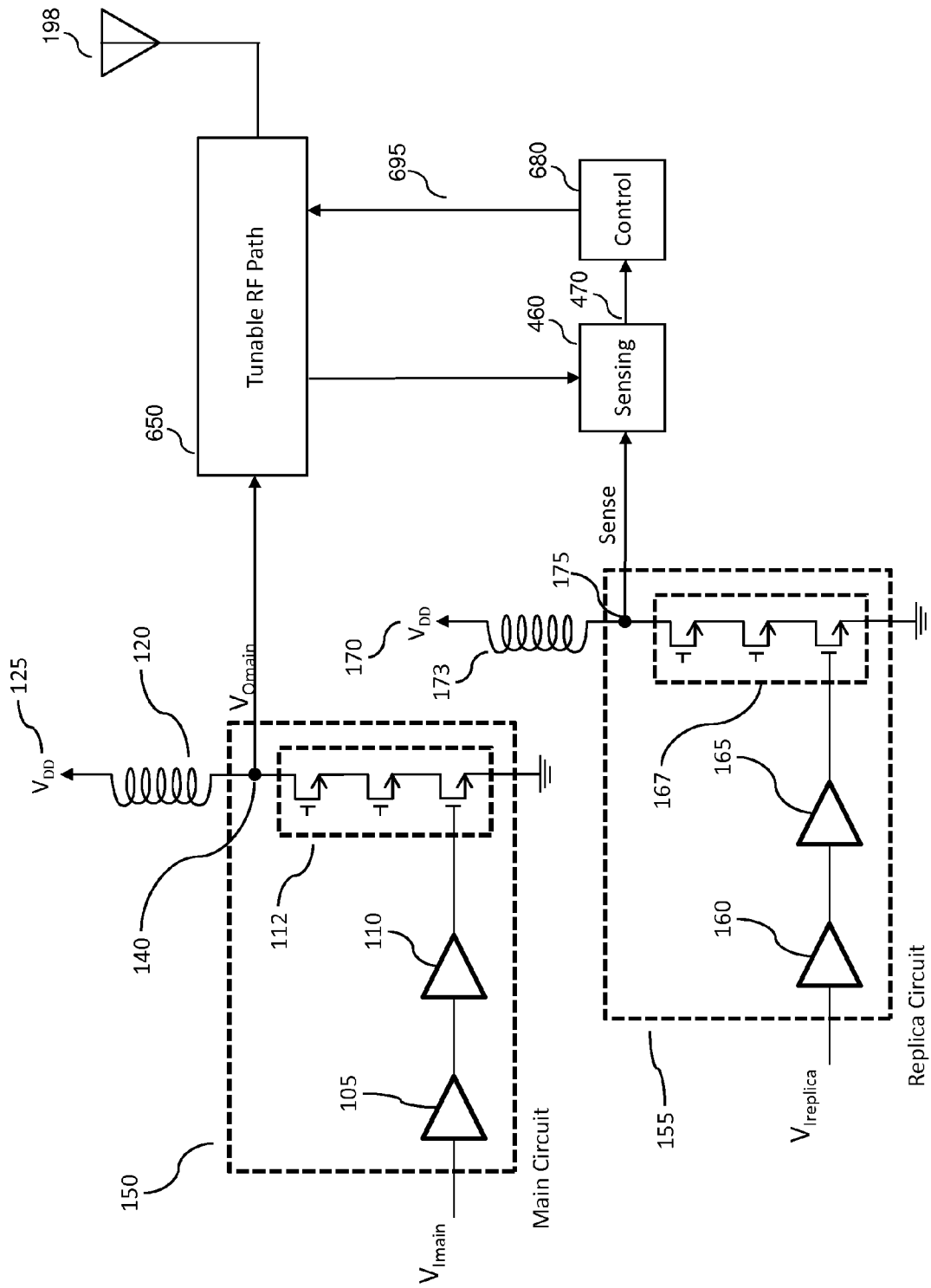
FIG. 6A shows an arrangement according to an embodiment of the present disclosure wherein a mismatch detected via the arrangement depicted in FIG. 4 is used to adjust a tunable RF path.

According to an embodiment of the present disclosure, by providing tunable elements in the RF path (450) of FIGS. 4, 5A-B, such tunable elements can be used to tune the RF path under control of one or more signals corresponding to the one or more mismatch signals provided at terminal (470), as depicted in FIG. 6A. As depicted in FIG. 6A, the one or more mismatch signals are provided to a control circuit (680) which in turn can scale (e.g. gain and/or offset) and/or further condition (e.g. A/D, D/A, V–I, I–V, etc. . . . ) the received signals and use to control the tunable elements of the tunable RF path (650). For a given operating point, such control can be performed in a single step wherein a one-time adjustment of one or more tuning elements affecting the given operating point is performed using one or more signals from (470), or multiple steps wherein an adjustment uses several consecutive such single steps, wherein each single step is followed by a subsequent sensing and comparison of the given operating point resulting in an updated set of measured mismatches reflecting changes in the given operating point due to the previous adjustment step, such as for example, per a feedback control scheme.

With further reference to the detection of a fault in operation of the combination of the main circuit, tunable RF path and associated output load, according to one embodiment of the present disclosure, the tunable RF path (650) can be tuned, for example during a factory test phase, to determine an ideal matching of the main circuit (150) to the output load (198). Based on such ideal matching, a loading impedance network $(Z_1, Z_2, \ldots, Z_{(n-1)}, Z_F)$ to the replica circuit (155) is provided and an associated tuned configuration of the RF path can be stored (e.g. memory storage). Such tuned configuration can comprise all controlling/tuning values to the various tunable elements of the tunable RF path such as to enable restoring of the ideal matching condition obtained during the factory test. During a different phase, such as an end-product test phase, where the circuit is operative in an end-product (e.g. cellular phone), the stored tuned configuration can be restored (e.g. recalled) and a mismatch in operating characteristic between an operating point (e.g. 555a, 555b, . . . , 555m) in the RF path and an associated reference operating point in the loading impedance network $(Z_1, Z_2, \ldots, Z_{(n-1)}, Z_F)$ of the replica circuit (155) can be detected. In such configuration a mismatch larger in amplitude (e.g. absolute value) than a certain factory preset value can be made to indicate a fault in the combination main circuit (150), tunable RF path (650) and output load (198). According to further embodiments, such mismatch can be checked over time to see if anything in the circuit degrades.

Figure 6B:
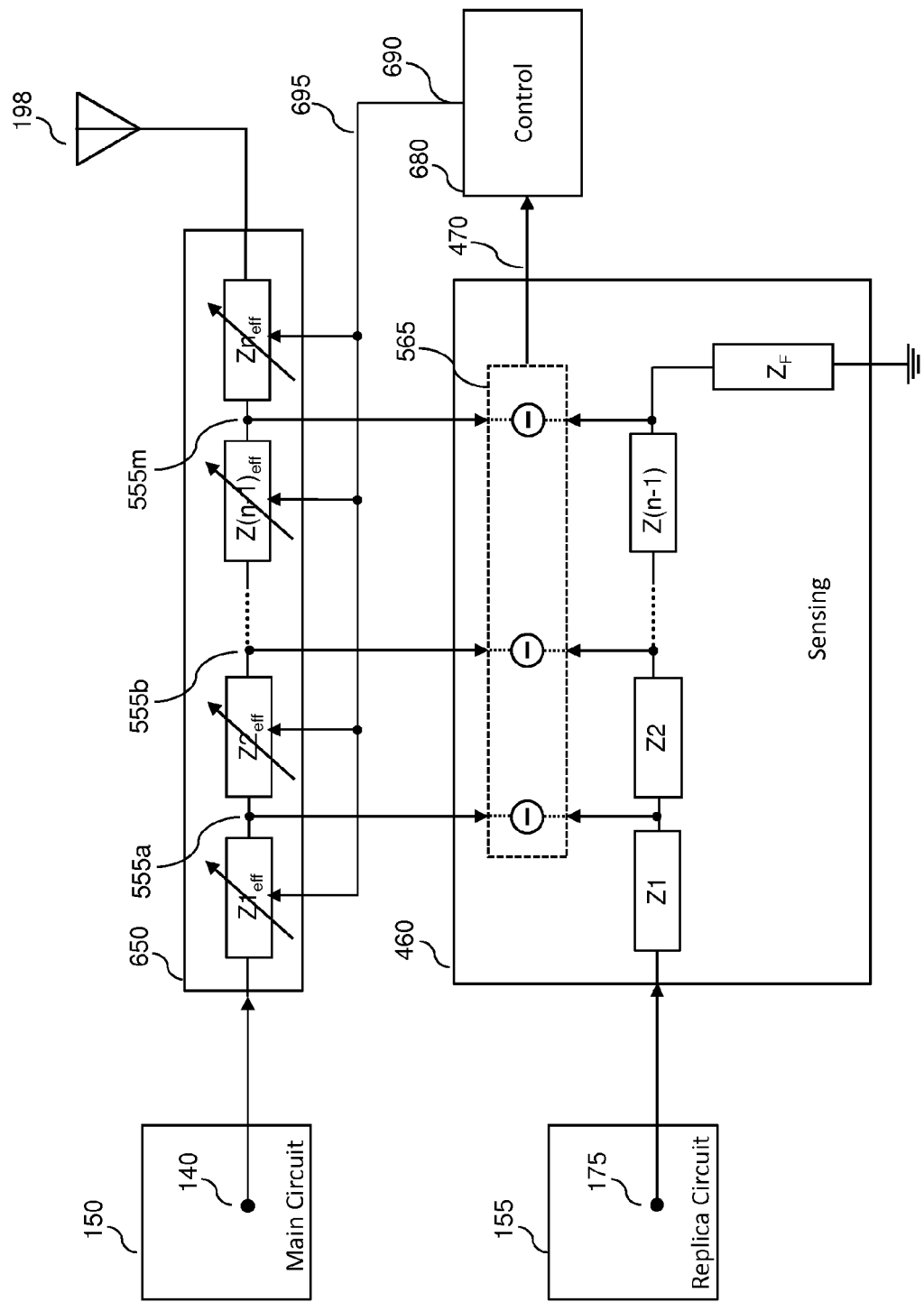
FIG. 6B shows more details of the tuning elements used in the arrangement of FIG. 6A.

FIG. 6B is an exemplary representation of the circuital arrangement of FIG. 6A, wherein some internal details of the tunable RF path (650) and the sensing circuit (460) are represented. As represented in the exemplary circuital representation of FIG. 6B, the tunable RF path (650) can comprise one or more tunable elements $(Z_{1eff}, Z_{2eff}, \ldots, Z_{neff})$ which can each be controlled via a control signal provided at terminal (690) of the control circuit (680). In a preferred implementation, the control circuit can adjust, either via a single step or a plurality of sequential steps, a tunable element $(Z_{1eff}, Z_{2eff}, \ldots, Z_{neff})$ of the tunable RF path (650) such as to minimize a difference (e.g. a difference signal) in operating characteristic between a sensed operating point (555a, 555b, . . . , 555m) of the tunable RF path (650) and a corresponding reference operating point of the replica circuit as provided by the loading network $(Z_1, Z_2, \ldots, Z_{(n-1)}, Z_F)$, and thereby obtaining a desired matched (e.g. essentially matched) operating mode of the main circuit with respect to its load (650, 198).

Although not the focus of the teachings according to the present disclosure, the person skilled in the art will know how to devise a variety of tuning methods using the circuital arrangement of FIGS. 6A-6B. In cases where more than two tunable elements are to be tuned, one may choose to tune each tunable element in a sequence, starting from the closest to the main circuit (150), such as $(Z1_{eff})$ and ending with the furthest $(Z_{neff})$, or vice versa. In other embodiments, the tunable RF path (650) may be divided in various stages (e.g. segments), each stage comprising one or more sequential (tunable) elements, and isolating each stage via a switch and a dummy load (e.g. a terminating switch), such as to allow adjusting each stage independently from a next stage (or stages). According to some embodiments of the present disclosure, each dummy load can represent a matched (desired) load of the RF path (450, 650) seen by a previous stage. Such embodiment according to the present disclosure is depicted in FIG. 6D, where a terminating switch (630) inserted between two tunable elements (625, 635) of the tunable RF path (650) can be used to tune a segment (e.g. stage) of the RF path (650) based on a sensed signal at an operating point (555a) of the RF path. According to this embodiment, the terminating switch can provide an ideal termination (632a) (e.g. $Z_L$, which can be a resistive or a reactive load) of the RF path at the operating point (555a) while isolating a segment of the RF path starting from tunable element (635). Therefore, a mismatch detected via a difference signal based on the operating point (555a) can represent an adjustment to be provided to the tunable element (625) in order to tune the RF path. Although FIG. 6D shows a single terminating switch for simplicity of the drawing, the skilled person readily understands that such terminating switch can be placed at various operating points in the RF path (650), such as, for example, points (555a, 555b, . . . , 555m), with a terminating load value according to the position of the switch within the RF path (650). Although not shown in FIG. 6D, in a case where the RF path is configured to operate according to different modes of operation (e.g. operating modes, see next section), the terminating load (632a) (e.g. of value $Z_L$) of the terminating switch can be made to be configurable and adapted to a selected mode of operation. More information about a terminating switch and related implementations in an RF circuit can be found, for example, in U.S. patent application Ser. No. 14/272,387 entitled "RF Transmit Path Calibration via On-Chip Dummy Load" filed on even date herewith and incorporated herein by reference in its entirety.

According to a further embodiment of the present disclosure, the terminating switch (630) can be used to detect a fault in operation of the combination main circuit (150), tunable RF path (650) and output load (198). Such switch can further pin point a segment of the combination where a fault in operation is occurring, the segment being delimited by the position of the terminating switch within the RF path. For example and with reference to FIG. 6D, the terminating switch (630) can provide an ideal matching condition, by terminating the RF path with load $Z_L$ at operating point (555a) of the RF path (650), and therefore a mismatch detected with respect to the operating point larger than the factory preset value when the tunable RF path is restored to the factory preset tuned configuration can indicate a fault in the segment of the RF path prior to the operating point (555a) or in the main circuit (150). Furthermore and according to further embodiments of the present disclosure, by inserting a plurality of terminating switches in the tunable RF path, as indicated in the prior section of the present disclosure, fault detection can be performed progressively such as to allow isolation of a fault within a segment of the RF path defined by two consecutive terminating switches. In a case where a terminating switch is placed between the antenna (198) and the RF path (650), fault detection with respect to the antenna can also be achieved (e.g. FIG. 6E, later described). For example, a reasonable mismatch (e.g. within factory preset value) with respect to operating point (555p) when the terminating switch is active (e.g. RF path terminated into load $Z_L$) and a mismatch larger than factory preset value when the terminating switch is inactive, can indicate a malfunction in the antenna circuitry (198).

According to some embodiment of the present disclosure, the main circuit (150) and the corresponding RF path (450, 650) can be configured to operate in a plurality of operating modes, wherein each mode can be associated with a different operating frequency and/or modulation scheme of a transmitted RF signal via the combination (150), (450, 650) and antenna (198). In such configuration, various tuning elements ($Z_{1eff}, Z_{2eff}, \ldots, Z_{neff}$) of the RF path (450, 650) are used to tune the RF path according to a desired/selected mode of operation. Similarly to the discussion presented above, each mode of operation can be associated with a desired matched load represented by the various elements of the RF path (450, 650) and which can be factory preset using the various tuning elements and a lookup table, or similar, storing configuration control data for each specific mode. These stored configuration data can be used to drive the control circuit (680), or similar, as default values for the tuning of the RF path (450) with respect to the selected mode of operation. In such configuration, further tuning of the RF path (450, 650) for better matching during operation can be obtained via the combination replica circuit (155) and sensing circuit (460) as explained in the previous sections of the present disclosure and as depicted in FIG. 6C.

Figure 6C:
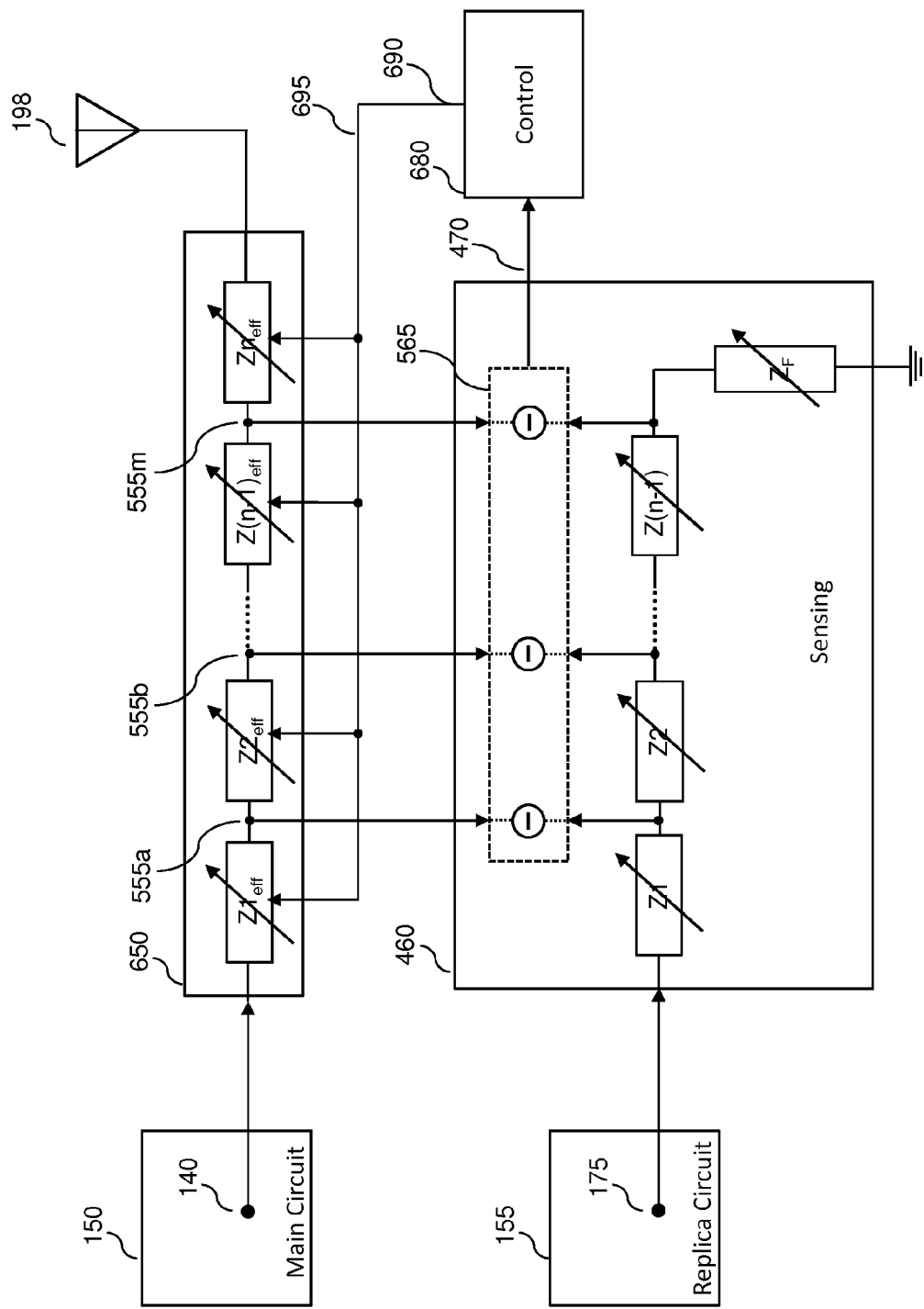
FIG. 6C shows an arrangement similar to one depicted in FIG. 6B wherein the arrangement is configured to operate at a plurality of modes of operation.
Figure 6D:
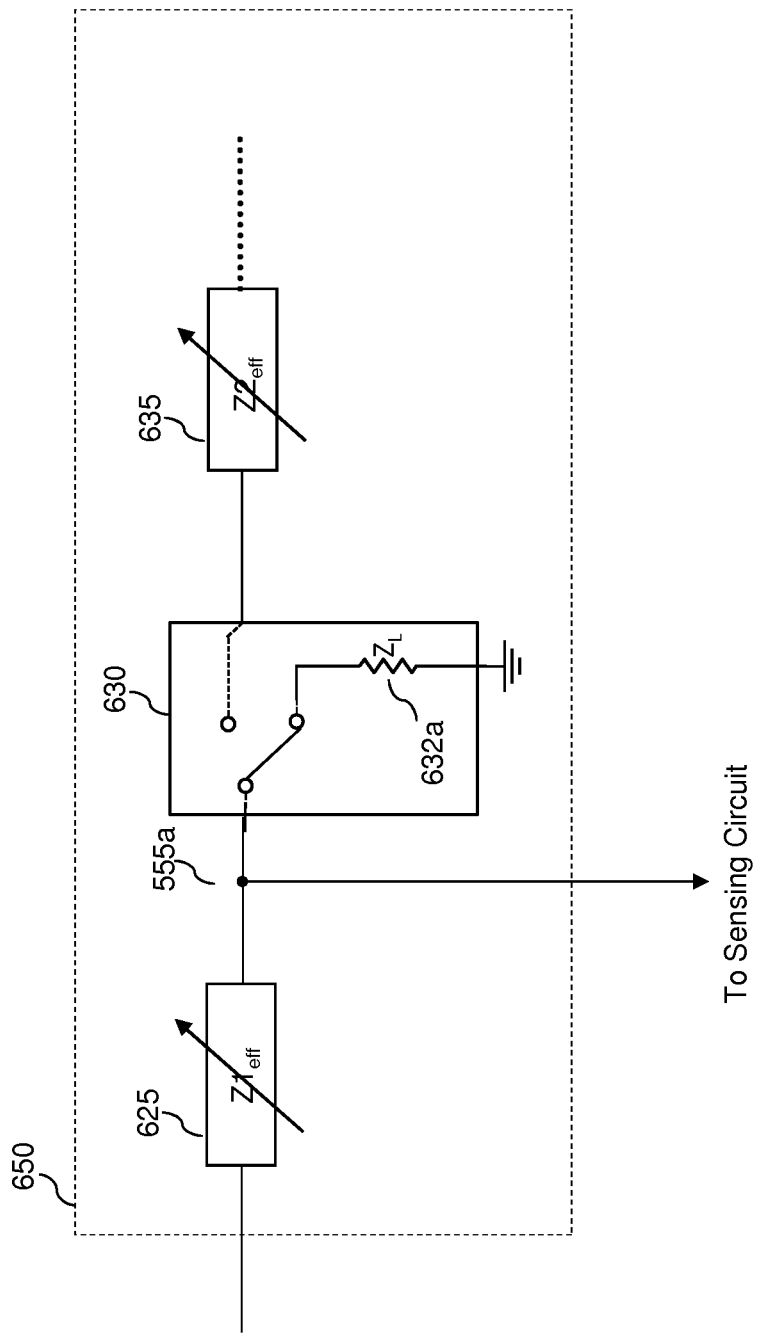
FIG. 6D shows a terminating switch which can be used to selectively tune a segment of a tunable RF path.

As depicted in FIG. 6C, the various loading elements ($Z_1, Z_2, \ldots, Z_{(n-1)}, Z_F$) provided to the replica circuit (155) via coupling to the sensing circuit (460) can be adjustable as to take values equal to (or representing) the factory preset matched values of ($Z_{1eff}, Z_{2eff}, \ldots, Z_{neff}$) for the various operating modes supported by the combination (150, 450, 198). As such, for a given selected mode of operation, the sensing circuit (460) is controlled to select a corresponding loading network configuration which can be used as a reference matching circuit to the replica circuit (155) for the selected mode of operation. This allows to further adjust the tuning of the RF path (650) with respect to its default configuration (e.g. provided by the default tuning values) using the tunable elements ($Z_{1eff}, Z_{2eff}, \ldots, Z_{neff}$) as per the various embodiments presented in the prior sections.

Figure 7:
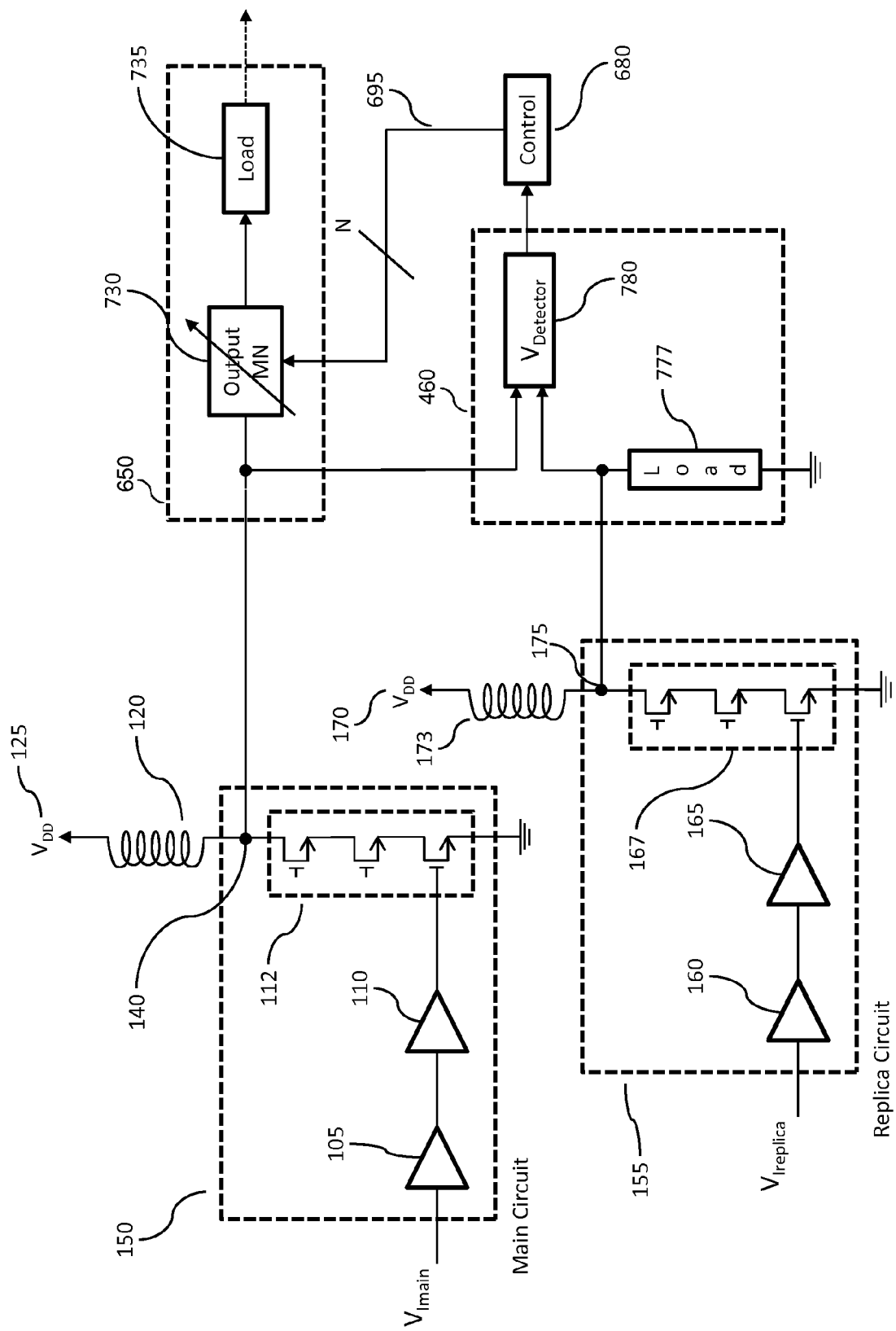
FIG. 7 shows an RF circuital arrangement capable of detecting an impedance mismatch, which can be used to derive a VSWR, according to an exemplary embodiment of the present disclosure.

FIG. 7 shows an exemplary implementation of the more general embodiments according to the present disclosure depicted in FIGS. 6A-6C. As previously noted ion the prior section of the present disclosure and as readily known to the person skilled in the art, the various elements comprised in the exemplary power amplifier module (150) of FIG. 7 do not necessary need to be as depicted, as many configurations for a power amplifier module are possible, such as a configuration comprising different number of amplifier stages (e.g. 105, 110, 112), such as one (e.g. 112 as per FIG. 3B) or two stages, or a configuration where the final amplifier stage (112) comprises a single RF transistor instead of the two or more stacked transistors depicted in FIG. 7. Configurations with two and more stacked RF transistors are described, for example, in U.S. Pat. No. 7,248,120. According to other exemplary embodiments, such amplifiers used in the amplifier module (150) can be configured for efficiency operation, such as, for example, envelope tracking amplification as described in U.S. patent application Ser. No. 13/829,946. Scalable periphery amplifiers, as described, for example, in the referenced U.S. patent application Ser. No. 13/797,779, may also be used in the amplifier module (150).

In the exemplary embodiment according to the present disclosure depicted in FIG. 7, the replica circuit (155) can be resistively loaded, but can also be inductively loaded in order to develop the same bias conditions and voltages as the main circuit (150). Load (777) represents the resistive or inductive load of the replica circuit (155). The replica circuit (155), the voltage detector (780), and the load (777) can be designed using standard techniques such that impedance of the output node (175) is matched to an impedance corresponding to a parallel combination of the second detected signal input terminal of the voltage detector (780) and the load (777). Alternatively, the voltage detector (780) can be designed such as to impact a loading to the node (175) in a reduced way and therefore design of the load (777) can be done with no consideration of the impact of the coupling to the voltage detector (780). According to some embodiments of the present disclosure, a load presented to the node (175) of the replica circuit (155), such as the load (777), can be same as a load presented to the node (140) of the main circuit (150) under the ideal matching condition (e.g. as derived, for example, during production testing of the circuit). Such load can therefore be inductive, capacitive or resistive. By designing the replica circuit (155) to have the same bias conditions (e.g. via a same device characteristics) and voltages as the main circuit (150) and impedance matching the output node (175) to the impedance of the second detected signal input terminal of the voltage detector (780), the replica circuit (155) can serve as a reference for comparison purposes to determine if an impedance mismatch is present at the output node (140) of the main circuit (150).

The main circuit (150) and the replica circuit (155) can be designed using techniques known to a person skilled in the art such that when the main circuit input voltage signal $V_{Imain}$ and the replica circuit input voltage signal $V_{Ireplica}$ are identical, such identical input voltages produce, by way of the main circuit (150) and the replica circuit (155), identical output voltages at output nodes (140, 175) under conditions of perfect impedance matching between the output node (140) and the load (735), latter load being coupled to the output node (140) via the tunable matching network (730). Also, according to the same embodiment, when the main circuit input voltage signal $V_{Imain}$ and the replica circuit input voltage signal $V_{Ireplica}$ are substantially identical, such identical input voltages produce substantially identical output voltages at output nodes (140, 175) under conditions of substantially matched impedance (e.g. substantially perfect impedance matching) between output node (140) and the load (735), such as, for example, to provide a desired operating characteristic of the combination main circuit (150) and the associated RF path (650). Impedance matching between the output node (140) and the load (735) can be performed by the tunable matching network (730) which couples the output node (140) to the load (735). As used herein, the term "substantially identical output voltages" can refer to output voltages which differ by a sufficiently small amount that circuit operation is not affected. As used herein, the term "substantially perfect impedance matching" or "essentially impedance matched" can refer to a situation where impedance mismatch (if any) is sufficiently small that circuit operation is not affected. According to some embodiments of the present disclosure, the term "substantially perfect impedance matching" or "essentially impedance matched" can refer to an impedance matching which generates a VSWR of not more than 1.5:1.

With continued reference to FIG. 7, the voltage detector (780) can calculate a difference between voltages $V_{Omain}$ and $V_{Oreplica}$, such difference hereafter referred to as "main-replica difference", in order to determine, for example, an associated VSWR. If there is no difference between voltages measured at the output nodes (140, 175), no impedance mismatch between the output node (140) of the main circuit (150) and the load (735) exists, indicating a VSWR of 1:1. A nonzero main-replica difference can indicate an impedance mismatch between the output node (140) and the load (735) and therefore a VSWR greater than 1:1.

As previously mentioned, the two circuits, main circuit (150) and replica circuit (155), can be designed to track each other by using scaled versions of input signals and devices of the circuits. In the case where the two circuits use scaling, output voltages at the output of each circuit can also be scaled and therefore an identical ideal matching condition for the two circuits can have different output voltages at each of the nodes (140) and (175). Such difference does not affect determination of the ideal condition so long as the scaling is known and the two circuits track each other.

According to one embodiment of the present disclosure, the main-replica difference drives control circuitry (680) of FIG. 7. In this embodiment, the control circuitry (680) adjusts impedance of the tunable matching network (730) via control signal(s) (695) in a manner so as to minimize the main-replica difference. The control signal(s) (695) can also be referred to as a controlling output and in a case where scaling is used, associated scaling parameters (e.g. offset and gain) describing the tracking relationship between the two circuits (e.g. 150, 155) can be built into the control circuit (680). By way of example, and not of limitation, design can be performed using control systems teachings where a feedback loop comprising the control circuitry (680) and the output matching network (730) accepts the main-replica difference, and treats the main-replica difference, including an offset and gain if necessary, as an error signal to be minimized by appropriate adjustment of the feedback loop. In particular, the feedback loop adjusts the tunable matching network (730) in order to minimize the error signal (main-replica difference).

Because the tunable matching network (730) can comprise one or more tunable components, the control circuitry (680) can produce one or more outputs (695), one to control each tunable component (e.g. DTC (digitally tunable capacitor), DTL (digitally tunable inductor)) in the tunable matching network (730). Potential multiplicity of control signal(s) (695) is indicated in FIG. 7 by a slash across the control circuitry output signal line (695) labeled "N", where N represents an integer greater than or equal to one. The control circuitry (680) can adjust the tunable matching network digitally, because tuning control is not necessarily a linear function. According to some embodiments of the present disclosure, a recursive search algorithm for minimizing the error signal (e.g. main-replica difference) can be implemented in the control circuitry (680) using the various tunable elements of the tunable matching circuit (730). Such search algorithm can look, for example, at an impact on the error signal of a step change in a value of one tunable element of the tunable match circuit (730) while considering a step change in value for each of the other tunable elements of the tunable match circuit. The person skilled in the art will know of various minimization search algorithms which can be used in conjunction with the various teachings of the present disclosure.

A tunable matching network, which can be used in the various embodiments of the present disclosure, is described, for example, in U.S. patent application Ser. No. 13/967,866, entitled "Tunable Impedance Matching Network", filed on Aug. 15, 2013, incorporated by reference herein in its entirety. According to one embodiment, the tunable matching network (730), and/or the various tunable impedance networks of FIGS. 5A-5B and 6A-6B, can comprise one or more tunable components (e.g. resistors, capacitors, and inductors), which can be adjusted in order to perform impedance matching for varying load conditions. The one or more tunable components can comprise digitally tunable capacitors (DTCs) and/or digitally tunable inductors (DTLs). Digitally tunable capacitors are described, for example, in International Application No. PCT/US2009/001358, entitled "Method and Apparatus for use in digitally tuning a capacitor in an integrated circuit device", filed on Mar. 2, 2009, the disclosure of which is incorporated by reference herein in its entirety. Digitally tunable inductors are described, for example, in to U.S. patent application Ser. No. 13/595,893, entitled "Methods and Apparatuses for Use in Tuning Reactance in a Circuit Device", filed on Aug. 27, 2012, the disclosure of which is incorporated herein by reference in its entirety.

Figure 6E:
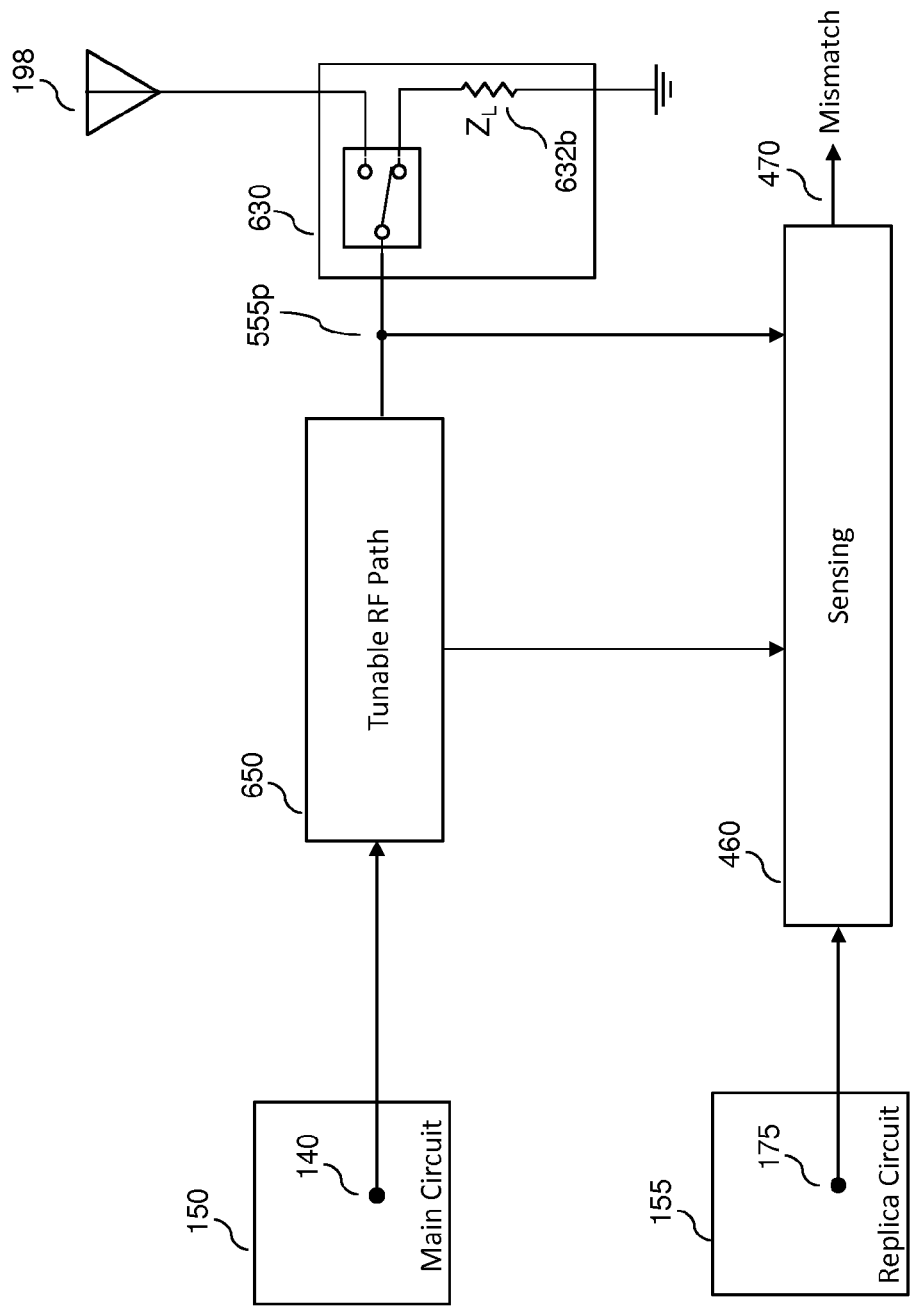
FIG. 6E shows a terminating switch which can be used to selectively provide an ideal matching load at the end of an RF path.

According to the embodiment shown in FIG. 7, the tunable matching network (730) is connected to a load (735). By way of example, and not of limitation, the load (735) could be a duplexer, a diplexer, an antenna or circuitry related to an antenna (e.g. an antenna switch), such as, for example, depicted in FIG. 1. As previously mentioned, at assembly time the antenna may have a particular surrounding environment, leading to a first value of antenna impedance. The main circuit (150) may be matched to the first value of the antenna impedance. If the environment surrounding the antenna changes, antenna impedance may change to a second value as a result of the environmental change. If the antenna is serving as a load (735) and antenna impedance changes, impedance of the load (735) would vary, causing impedance mismatch between the output node (140) of the main circuit (150) and the load (735). The tunable matching network (730) can be adjusted to perform impedance matching, thereby reducing mismatch between the impedance of the load (735) and impedance of the output node (140). Similarly, such matching may be performed at a certain temperature of the final stage amplifier (140) and the tunable match circuit (730) which can affect an output impedance of the final stage amplifier (140) and an input impedance of the tunable match circuit seen by the final stage amplifier, and therefore the matching between the two can drift as a function of an operating temperature. According to a further embodiment of the present disclosure as depicted in FIG. 6E, a terminating switch (630), as described in the prior sections of the present disclosure, can be provided at a point between the RF path (650) and the antenna (198), such as to further enabling fault detection due to a faulty antenna via the replica circuit. In such exemplary configuration, the terminating load (632b) presented by the terminating switch (630) can have an impedance value ($Z_L$) matching an ideal value of the antenna (198) as determined during design and/or testing/assembly phases of a corresponding system (e.g. cellular phone). By contrasting a mismatch between the sensing point (555p) and a corresponding reference point generated by the replica circuit (155) in the sensing circuit (460) for a case where terminating load at point (555p) is ($Z_L$) and a case where the terminating load at point (555p) is the antenna (198), a fault attributed to the antenna (198) can be detected. As described in the prior related sections of the present disclosure, main circuit to replica circuit mismatch can be determined while setting the tunable RF path (650) to its tuned configuration. The additional terminating switch (630) of FIG. 6E allows to provision of a tuned (e.g. ideal) end load to the RF path (650).

Furthermore and as previously noted according to various embodiments of the present disclosure, the main circuit (150) can be used to transmit a radio frequency (RF) signal according to one or more frequency bands and channels and therefore the tunable match circuit (730) can require a different matching according to a corresponding mode of operation (e.g. frequency band, channel). For each such mode of operation, the ideal matching can be determined during a production step of a device within which the circuital arrangement of FIG. 7 is used. In such case where various modes of operation are desired, the load (777) can be configurable (e.g. tunable) to reflect an ideal impedance as determined during the production step to provide an ideal match.

The devices according to the present disclosure can also be used, by way of example, and not of limitation, with power amplifiers present in amplitude modulators, such as those found in EDGE type GSM radios.

Accordingly, what has been shown are devices and methods for mismatch detection of an operating characteristic using a replica circuit, which in turn can be used to derive, for example, a corresponding VSWR component. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. An arrangement for detecting and controlling impedance mismatch in a radio frequency (RF) circuit, comprising:
   a first RF circuit that is configured, during operation of the arrangement, to amplify a first input signal, thus producing a first output signal at an output port of the first RF circuit that is an amplified version of the first input signal;
   a first load coupled to the output port of the first RF circuit;
   a second RF circuit that is configured, during operation of the arrangement, to amplify a second input signal, thus producing a second output signal that is an amplified version of the second input signal, the second RF circuit being a reduced size replica of the first RF circuit;
   a second load connected to an output terminal of the second RF circuit, configured, during operation of the arrangement, to provide a substantially matched impedance at the output terminal of the second RF circuit; and
   a detector that is configured, during operation of the arrangement, to compute a difference between the first output signal and the second output signal, thus producing a difference signal, wherein the difference signal is a function of impedance mismatch between the first RF circuit and the first load.

2. The arrangement according to claim 1, further comprising a tunable matching network connected between the output port of the first circuit and the first load.

3. The arrangement of claim 2, further comprising a control circuit that is configured during operation of the arrangement, to accept the difference signal as an input and produce one or more control signals, the control signals being sent to the tunable matching network and being adapted, during operation of the arrangement, to adjust the tunable matching network such as to reduce a magnitude of the difference signal, thus detecting and controlling impedance mismatch between the first RF circuit and the first load.

4. The arrangement according to claim 2, wherein the first RF circuit and the second RF circuit are configured such that, during operation of the arrangement, the first output signal and the second output signal are substantially identical if:
   the first input signal and the second input signal are substantially identical, and
   the tunable matching network is adjusted such that impedance of the first load is substantially matched to an impedance of the output port of the first RF circuit.

5. The arrangement according to claim 2, wherein the tunable matching network comprises digitally tunable capacitors and/or digitally tunable inductors.

6. The arrangement according to claim 1, wherein the first input signal and the second input signal are equal.

7. The arrangement according to claim 1, wherein the first RF circuit and the second RF circuit comprise one or more amplifiers.

8. The arrangement according to claim 1, wherein the first output signal and the second output signal are one of: a) voltage signals, b) current signals, and c) power signals.

9. The arrangement according to claim 1, wherein the first input signal and the second input signal are one of: a) voltage signals, b) current signals, and c) power signals.

10. The arrangement according to claim 1, wherein the control signals comprise digital signals.

11. The arrangement according to claim 1, wherein the reduced size of the second RF circuit is about $1/100^{th}$ or less a size of the first RF circuit, such as a current flow and a power consumption of the second RF circuit is about $1/100^{th}$ or less of a current flow and a power consumption of the first RF circuit.

12. The arrangement according to claim 11, wherein the first RF circuit and the second RF circuit are monolithically integrated on a same integrated circuit.

13. The arrangement according to claim 12, wherein the second load is monolithically integrated on the same integrated circuit.

14. The arrangement according to claim 12 or claim 13 fabricated using a technology comprising one of: a) silicon on sapphire, b) silicon on insulator, and c) bulk-silicon.

15. The arrangement according to claim 1, wherein the second input signal is a scaled version of the first input signal.

16. The arrangement according to claim 15, wherein during operation of the arrangement, the second RF circuit is configured to track the first RF circuit, such as the difference signal remains a function of impedance mismatch between the first RF circuit and the first load.

17. An arrangement, comprising:
   a detector having a first input terminal, a second input terminal, and an output terminal;
   a first amplifying circuit having an amplified output connected, in operation, to a radio frequency (RF) path comprising one or more RF components, the first circuit adapted to receive, in operation, an (RF) signal input, wherein a first sensing point in the RF path is connected to the first input terminal of the detector; and
   a second amplifying circuit having an amplified output connected, in operation, to an impedance network, the second circuit adapted to receive, in operation, a scaled version of the RF signal input, the second circuit being a reduced size replica of the first circuit, wherein a first reference point in the impedance network is connected to the second input terminal of the detector,
   wherein the detector is adapted, during operation of the arrangement, to detect a difference signal based on a difference between an operating characteristic of the first amplifying circuit associated to the first sensing point and an operating characteristic of the second amplifying circuit associated to the first reference point.

18. The arrangement according to claim 17, wherein the impedance network comprises impedance components with values in correspondence of desired matching values of the one or more RF components of the RF path with respect to a first load to the RF path.

19. The arrangement of claim 18, further comprising a control circuit connected with the output terminal of the detector, the control circuit adapted to generate a controlling output indicative of the difference signal.

20. The arrangement of claim 19, wherein the one or more RF components comprise a tunable matching network having a first terminal coupled, in operation, with the amplified output of the first circuit, a second terminal connected, in operation, with the controlling output of the control circuit, and a third terminal coupled, in operation, with the first load.

21. The arrangement of claim 20, wherein an input signal associated to the first terminal of the tunable matching network is an analog input signal and an input signal associated to the second terminal of the tunable matching network is a digital input signal.

22. The arrangement according to claim 20, wherein the tunable matching network is placed between the amplified output of the first circuit and the first sensing point.

23. The arrangement according to claim 22, further comprising a terminating switch between the first sensing point and a next RF component of the one or more RF components, wherein the terminating switch is configured, during operation, to selectively conduct a current flow of the RF path into a terminating load connected to a terminating terminal of the switch.

24. The arrangement according to claim 23, wherein an impedance value of the terminating load is based on a value of an impedance of a matching load seen at the first sensing point of the RF path.

25. The arrangement according to claim 20, wherein an impedance value seen at the first reference point of the impedance network is based on a tuned impedance value seen at the first sensing point of the RF path, wherein the tuned impedance value is in correspondence of the desired matching values of the one or more RF components of the RF path with respect to the first load.

26. The arrangement according to claim 25, wherein the tunable matching network is configured, during operation of the arrangement, to vary an impedance value seen at the first sensing point based on the controlling output of the control circuit.

27. The arrangement according to claim 26, wherein the impedance value seen at the first sensing point is essentially the tuned impedance value when the difference signal is minimized.

28. The arrangement according to claim 25, wherein the tuned impedance value is based on a mode of operation of the first amplifying circuit.

29. The arrangement according to claim 28, wherein the impedance components of the impedance network comprise configurable impedance values, wherein the configurable impedance values are set according to a mode of operation of the first amplifying circuit.

30. The arrangement according to claim 17, wherein the scaled version of the RF signal is the RF signal.

31. The arrangement according to claim 17, wherein a size of the second amplifying circuit is about $1/100^{th}$ or less a size of the first amplifying circuit, such as a current flow and a power consumption of the second amplifying circuit is about $1/100^{th}$ or less of a current flow and a power consumption of the first amplifying circuit.

32. The arrangement according to claim 31, wherein the first amplifying circuit and the second amplifying circuit are monolithically integrated on a same integrated circuit.

33. The arrangement according to claim 32 fabricated using a technology comprising one of: a) silicon on sapphire, b) silicon on insulator, and c) bulk-silicon.

34. The arrangement according to claim 17, wherein the operating characteristic is in correspondence of one of: a) a voltage signal, b) a current signal, and c) a power signal.

35. The arrangement according to claim 17, further comprising a plurality of first sensing points in the RF path and a plurality of corresponding first reference points in the impedance network, wherein the detector is further adapted, during operation of the arrangement, to detect a difference signal based on a difference between an operating characteristic of the first amplifying circuit associated to a first sensing point of the plurality of first sensing points and an operating characteristic of the second amplifying circuit associated to a corresponding first reference point of the plurality of first reference points.

36. The arrangement according to claim 35, further comprising a plurality of terminating switches configured to selectively terminate the plurality of first sensing points with a corresponding ideal matching load.

37. The arrangement according to claim 36 wherein during operation, the detector is further adapted to detect a fault in operation of the combined first amplifying circuit and RF path based on a detected difference signal.

38. The arrangement according to claim 37, wherein the detector is further adapted to detect a fault in operation in a segment of the RF path delimited by two first sensing points of the plurality of sensing points based on a difference of detected difference signals.

39. The arrangement according to claim 38, wherein the difference is based on a detected difference signal for a case where a terminating switch terminates an associated first sensing point and a case where the terminating switch does not terminate the associated first sensing point.

40. A method for load mismatch detection in a radio frequency (RF) circuital arrangement, the method comprising:
   amplifying an RF signal via a first amplifying circuit;
   based on the amplifying, matching a first amplified signal to a first load via a tunable matching circuit;
   amplifying a scaled version of the RF signal via a second amplifying circuit, the second amplifying circuit being a reduced size version of the first amplifying circuit;
   based on the matching, providing a second load to the second amplifying circuit;
   based on the providing, measuring a difference in an operating characteristic between the first amplified signal and the second amplified signal, and
   based on the measuring, detecting a mismatch between the first amplified signal and the first load.

41. The method of claim 40, further comprising:
   based on the detecting, tuning the tunable matching circuit, and
   based on the tuning, matching the first amplified signal to the first load.

42. The method of claim 41, further comprising:
   based on the matching, maintaining a desired voltage standing wave ratio (VSWR).

43. The method of claim 42, wherein the desired VSWR is no more than 1.5:1.

44. The method of claim 40, wherein the operating characteristic comprises one of: a) a voltage signal, b) a current signal, and c) a power signal.

45. The method of claim 40, wherein the providing of the second load is further dependent on a mode of operation of the first amplifying circuit.

46. The method of claim 45, wherein a mode of operation is in correspondence of a frequency band and/or channel of operation.

47. The method of claim 40, wherein the second amplifying circuit is a reduced size version of the first amplifying circuit by a factor of about 100 or more.

48. A method for component fault detection in a radio frequency (RF) circuital arrangement, the method comprising:
 during a first phase of operation of the arrangement, performing the following steps i) to v):
  i) amplifying an RF signal via a first amplifying circuit;
  ii) based on the amplifying, matching a first amplified signal to a first load via a tunable matching circuit;
  iii) based on the matching, storing a configuration of the tunable matching circuit;
  iv) providing a second amplifying circuit, the second amplifying circuit being a reduced size version of the first amplifying circuit; and
  v) based on the matching, providing a second load to the second amplifying circuit;
 during a second phase of operation of the arrangement, performing the following steps vi) to x):
  vi) restoring the configuration of the tunable matching circuit based on the matching;
  vii) amplifying an RF signal via the first amplifying circuit;
  viii) amplifying a scaled version of the RF signal via the second amplifying circuit;
  ix) measuring a difference signal based on a difference in an operating characteristic between an amplified signal at the first load and an amplified signal at the second load; and
  x) based on the measuring, determining a fault in the arrangement.

49. The method according to claim 48, wherein the operating characteristic comprises one of: a) a voltage signal, b) a current signal, and c) a power signal.

* * * * *